United States Patent
Kiuchi

(10) Patent No.: US 11,287,643 B2
(45) Date of Patent: Mar. 29, 2022

(54) DISPLACEMENT ENLARGING MECHANISM AND OPTICAL APPARATUS USING THE SAME

(71) Applicant: SUMITOMO PRECISION PRODUCTS CO., LTD., Hyogo (JP)

(72) Inventor: Mario Kiuchi, Hyogo (JP)

(73) Assignee: SUMITOMO PRECISION PRODUCTS CO., LTD., Hyogo (JP)

( * ) Notice: Subject to any disclaimer, the term of this patent is extended or adjusted under 35 U.S.C. 154(b) by 457 days.

(21) Appl. No.: 16/492,833

(22) PCT Filed: Mar. 8, 2018

(86) PCT No.: PCT/JP2018/009081
§ 371 (c)(1),
(2) Date: Sep. 10, 2019

(87) PCT Pub. No.: WO2018/168659
PCT Pub. Date: Sep. 20, 2018

(65) Prior Publication Data
US 2020/0150417 A1    May 14, 2020

(30) Foreign Application Priority Data

Mar. 17, 2017  (JP) .............................. JP2017-052013

(51) Int. Cl.
*G02B 26/08* (2006.01)
*B81B 3/00* (2006.01)
(Continued)

(52) U.S. Cl.
CPC ........ *G02B 26/0858* (2013.01); *B81B 3/0021* (2013.01); *G02B 7/1821* (2013.01); *B81B 2201/04* (2013.01); *H01L 41/09* (2013.01)

(58) Field of Classification Search
CPC .............. G02B 26/0858; G02B 7/1821; G02B 26/0866; B81B 3/0021; B81B 2201/04;
(Continued)

(56) References Cited

U.S. PATENT DOCUMENTS

2019/0235232 A1*  8/2019  Sekine ............... G02B 26/0858

FOREIGN PATENT DOCUMENTS

JP       H06-046207 A       2/1994

OTHER PUBLICATIONS

International Search Report for corresponding International Application No. PCT/JP2018/009081, dated May 29, 2018.

* cited by examiner

*Primary Examiner* — Euncha P Cherry
(74) *Attorney, Agent, or Firm* — Renner, Otto, Boisselle & Sklar, LLP

(57) ABSTRACT

A displacement enlarging mechanism includes a substrate, a fixing portion provided at the substrate, an actuator coupled to the fixing portion, a beam extending in a direction substantially parallel to an upper surface of the substrate and having a base end side has been coupled to the actuator and coupled to the fixing portion and having folded back in a direction crossing the upper surface of the substrate, and a coupling portion and a mirror coupled to a folded-back portion formed by folding back of the beam. The actuator drives the beam to push or pull the beam from the base end side in the direction of the folded-back portion.

17 Claims, 20 Drawing Sheets

(51) Int. Cl.
*G02B 7/182* (2021.01)
*H01L 41/09* (2006.01)

(58) Field of Classification Search
CPC . B81B 3/0037; B81B 2201/042; H01L 41/09; F03G 7/06; G01J 1/02; G01J 1/04
USPC ..................................................... 359/224.1
See application file for complete search history.

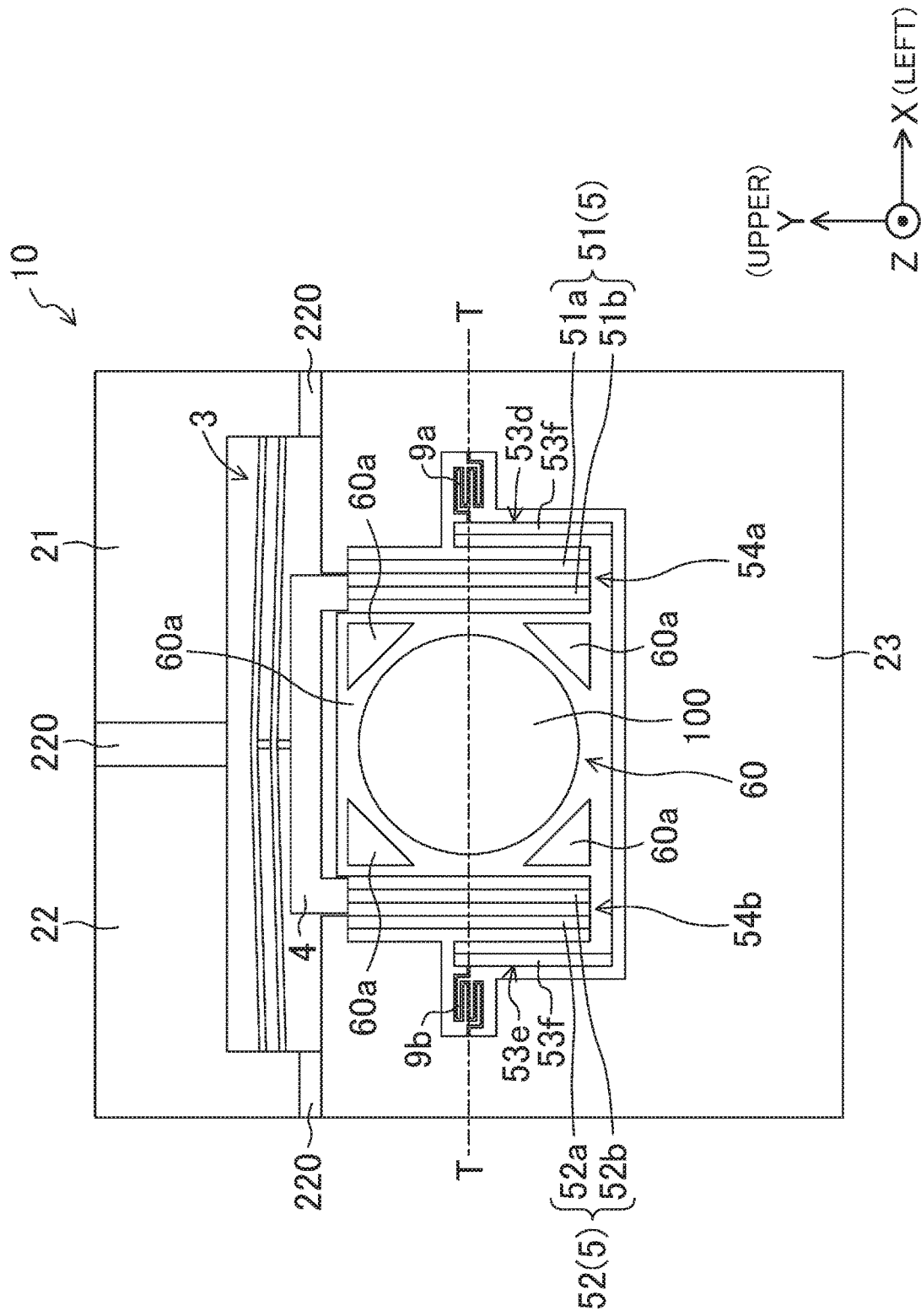

FIG.20
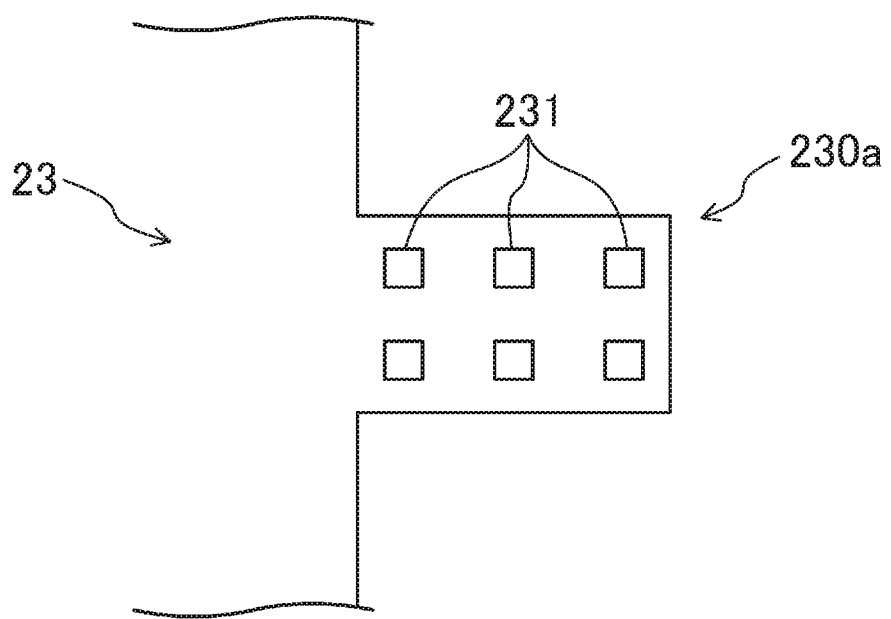
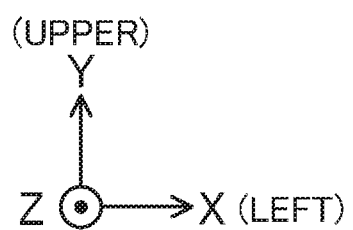

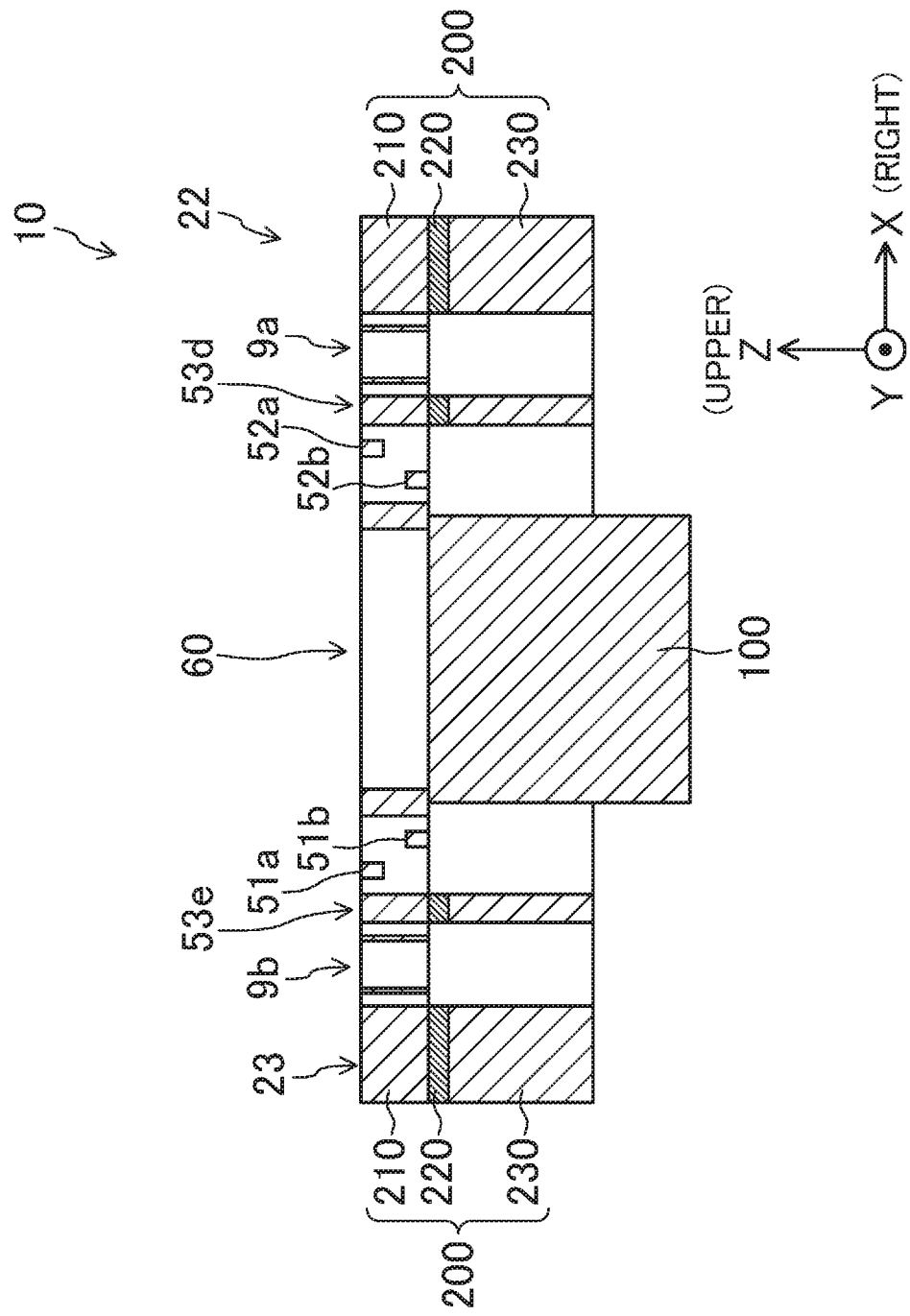

DISPLACEMENT ENLARGING MECHANISM AND OPTICAL APPARATUS USING THE SAME

TECHNICAL FIELD

The technique disclosed herein relates to a displacement enlarging mechanism and an optical apparatus using the displacement enlarging mechanism.

BACKGROUND ART

Typically, various mirror apparatuses have been known. For example, a mirror apparatus disclosed in Patent Document 1 includes an actuator configured such that a piezoelectric element is stacked on a surface of the actuator, and a mirror coupled to a tip end of the actuator. This mirror apparatus curves the actuator by voltage application to the piezoelectric element to tilt the mirror.

CITATION LIST

Patent Document

PATENT DOCUMENT 1: Japanese Unexamined Patent Publication No. 06-46207

SUMMARY OF THE INVENTION

Technical Problem

In the mirror apparatus disclosed in Patent Document 1, when an attempt is made to increase a mirror tilting amount, voltage to be applied to the piezoelectric element needs to be increased. For example, for obtaining a tilting angle of several degrees, the voltage to be applied to the piezoelectric element needs to be equal to or higher than several tens of V, and therefore, an expensive power source is necessary. Moreover, power consumption increases, and measures for safety in the mirror apparatus need to be taken for high voltage application. Similarly in the case of using an electrostatic drive actuator, a drive voltage needs to be equal to or higher than several tens of V for obtaining a tilting angle of several degrees.

On the other hand, a thermal actuator configured to heat a drive beam by power distribution to obtain drive force by thermal expansion of the drive beam can obtain a great drive amount with a low voltage. However, the actuator of this type is driven in a plane in which the drive beam extends. Thus, in a case where planes in which a mirror surface and the drive beam extend are at the same position or parallel positions, it is difficult to tilt a mirror in a direction crossing the mirror surface.

The technique disclosed herein has been made in view of such a point, and an object of the technique is to provide a displacement enlarging mechanism configured so that a movement portion such as a mirror can be tilted with respect to a direction crossing a surface of the movement portion and the tilting amount of the movement portion can be increased and an optical apparatus using the displacement enlarging mechanism.

Solution to the Problem

For accomplishing the above-described object, in the technique disclosed herein, a beam coupled to an actuator is folded back in a direction crossing an upper surface of a substrate, and is arranged at different levels. A folded-back portion and a mirror coupled to the folded-back portion are tilted by pushing/pulling of the beam by the actuator.

Specifically, the displacement enlarging mechanism disclosed herein includes a substrate, a fixing portion provided at the substrate, an actuator coupled to the fixing portion, a beam extending in a direction substantially parallel to an upper surface of the substrate and having a base end side coupled to the actuator, extending toward the base end side and having folded back in a direction crossing the upper surface at a folded-back portion of an intermediate portion, and coupled to the fixing portion on a tip end side, and a movement portion coupled to the folded-back portion of the beam. The actuator drives the beam to push or pull the beam from the base end side in a folded-back portion direction.

According to this configuration, the beam folded back in the direction crossing the upper surface of the substrate is pushed/pulled from the base end side to a folded-back portion side by the actuator. Thus, the beam coupled to the fixing portion is curved to drive the folded-back portion of the beam, and the movement portion coupled thereto is tilted. With this configuration, the movement portion can be greatly tilted with slight displacement of the actuator.

Moreover, the optical apparatus disclosed herein includes the above-described displacement enlarging mechanism, a first electrode arranged on the fixing portion of the displacement enlarging mechanism and electrically connected to one end of the actuator, and a second electrode arranged on the fixing portion of the displacement enlarging mechanism and electrically connected to the other end of the actuator. The movement portion reflects light entering the displacement enlarging mechanism, allows the light to penetrate the movement portion, or absorbs the light.

According to this configuration, the tilting amount of the movement portion can be increased, and the drive voltage of the actuator can be decreased.

Advantages of the Invention

According to the displacement enlarging mechanism of the present disclosure, the movement portion such as the mirror can be tilted with respect to the direction crossing the mirror surface, and the tilting amount can be increased. Moreover, the optical apparatus of the present disclosure can greatly tilt the movement portion such as the mirror with a low drive voltage.

BRIEF DESCRIPTION OF THE DRAWINGS

FIG. 16 is a plan view of a wavelength selection filter apparatus according to a third embodiment from below.

FIG. 20 is a plan view of a heat dissipation block from below.

FIG. 21 is a sectional view of another wavelength selection filter apparatus.

DESCRIPTION OF EMBODIMENTS

Hereinafter, the present embodiments will be described in detail with reference to the drawings. Description of the preferable embodiments below will be set forth merely as examples in nature, and is not intended to limit the present disclosure, an application thereof, and a use application thereof at all.

First Embodiment

[Configuration of Mirror Apparatus]

Figure 1:
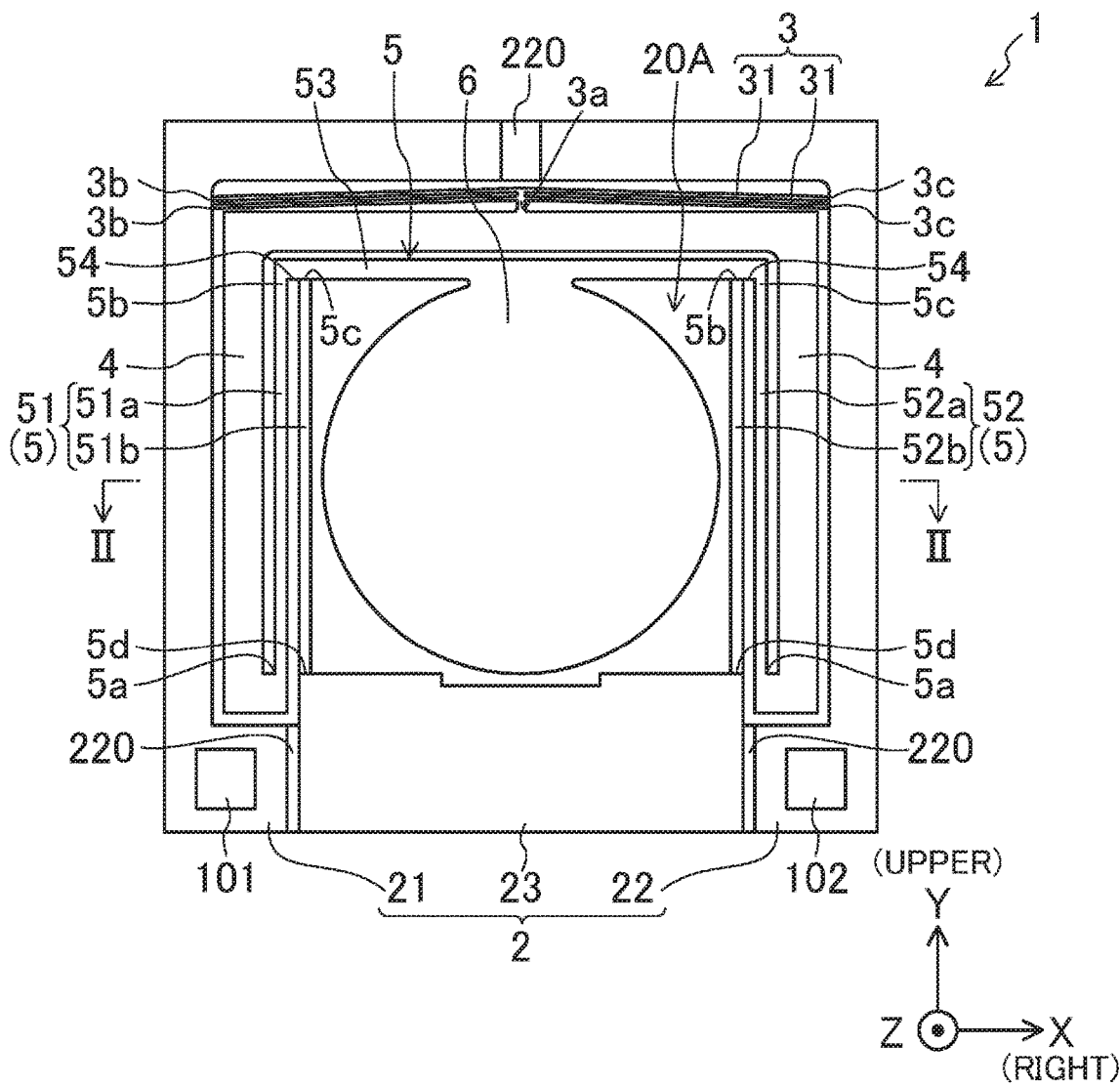
FIG. 1 is a plan view of a mirror apparatus according to a first embodiment.
Figure 2:
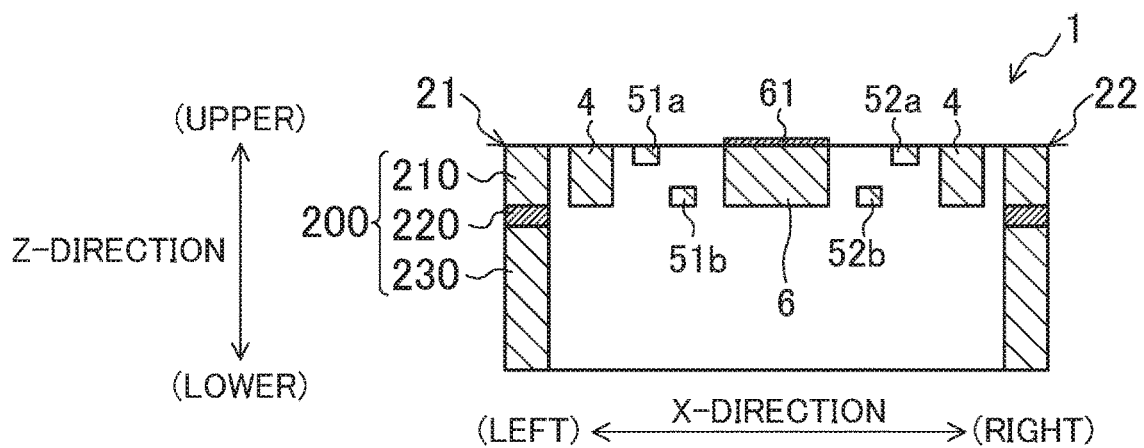
FIG. 2 is a sectional view along an II-II line in FIG. 1.

FIG. 1 illustrates a plan view of a mirror apparatus according to the present embodiment, and FIG. 2 illustrates a sectional view along an II-II line in FIG. 1. The mirror apparatus 1 includes the following members on a SOI substrate 200. The mirror apparatus 1 includes a fixing portion 2, an actuator 3 coupled to the fixing portion 2, a diverting beam 4 coupled to the actuator 3, and a beam 5 having first end portions 5a coupled to the diverting beam 4 and having fourth end portions 5d coupled to the fixing portion 2. Moreover, the beam 5 has a first beam 51 and a second beam 52 arranged facing the first beam 51 through a mirror 6. Further, the mirror apparatus 1 has a coupling portion 53 coupled to the first beam 51 and the second beam 52 at both ends, and the mirror 6 coupled to an intermediate portion of the coupling portion 53. An element coupled to a later-described folded-back portion 54 is a movement portion. In the present embodiment, the coupling portion 53 and the mirror 6 correspond to the movement portion described in the claims. The mirror apparatus 1 includes a first electrode 101 and a second electrode 102 provided at the fixing portion 2.

Moreover, the SOI substrate 200 includes a device layer (a first silicon layer 210), a Box layer (an oxide layer 220), and a handle layer (a second silicon layer 230). For example, the thickness of the device layer is 30 µm, the thickness of the Box layer is 1 µm, and the thickness of the handle layer is 250 µm.

Hereinafter, a longitudinal direction of the actuator 3 will be, for the sake of convenience in description, referred to as a "X-direction," a longitudinal direction of the first beam 51 and the second beam 52 will be referred to as a "Y-direction," and a thickness direction of the mirror apparatus 1 will be referred to as a "Z-direction." Note that in the X-direction, a left side in FIG. 1 will be sometimes merely referred to as a "left side," and a right side in FIG. 1 will be sometimes merely referred to as a "right side." In the Y-direction, an upper side in FIG. 1 will be sometimes merely referred to as an "upper side," and a lower side in FIG. 1 will be sometimes merely referred to as a "lower side." In the Z-direction, an upper side in FIG. 2 will be sometimes referred to as an "upper surface," and a lower side in FIG. 2 will be sometimes referred to as a "lower surface." Moreover, the first end portions 5a will be sometimes referred to as a "base end," and the fourth end portions 5d will be sometimes referred to as a "tip end."

As illustrated in FIG. 1, the mirror apparatus 1 has, for example, a rectangular entire shape as viewed in plane. The fixing portion 2 is a frame forming such a rectangular entire shape of the mirror apparatus 1 as viewed in plane. The fixing portion 2 includes a first base member 21 and a second base member 22 arranged facing each other in the Y-direction, and a third base member 23 provided between the first base member 21 and the second base member 22 on the lower side in the Y-direction. Any of the first base member 21, the second base member 22, and the third base member 23 is formed in a shape covering as broad area as possible while movable areas of the actuator 3, the diverting beam 4, the first beam 51, the second beam 52, the coupling portion 53, and the mirror 6 are ensured.

Note that the fixing portion 2 is divided into three parts of the first base member 21, the second base member 22, and the third base member 23 at the first silicon layer 210, but is connected as one at the oxide layer 220 and the second silicon layer 230. Thus, the relative positions of the first base member 21, the second base member 22, and the third base member 23 are fixed, and the movable members can be supported by the first base member 21, the second base member 22, and the third base member 23.

Moreover, the fixing portion 2 has an opening 20A between the first base member 21 and the second base member 22, and as viewed in plane, the actuator 3, the diverting beam 4, the first beam 51, the second beam 52, the coupling portion 53, and the mirror 6 are each arranged in the opening 20A. The fixing portion 2 and each of the above-described movable members arranged in the opening 20A form a displacement enlarging mechanism.

As described above, the fixing portion 2 is formed in the shape covering as broad area as possible while the movable areas of the movable members are ensured, and therefore, ensures a high stiffness necessary as the frame supporting the actuator 3.

The actuator 3 is arranged on the upper side in the Y-direction in the mirror apparatus 1. Moreover, the actuator 3 includes two actuators 31 arranged in parallel. These two actuators 31 are rod-shaped drive beams extending in the X-direction, and are coupled to each other at an intermediate portion 3a at the substantially center from a first end portion 3b to a second end portion 3c of the actuator 3 in the longitudinal direction thereof. As described above, two actuators 31 are coupled to each other at the intermediate portion 3a, and therefore, drive force of two actuators 31 is combined so that the actuator 3 can provide great drive force.

The first end portions 3b of two actuators 31 are coupled to the first base member 21. The second end portions 3c of two actuators 31 are coupled to the second base member 22.

Moreover, the actuator 3 does not extend straight in the X-direction, and the intermediate portion 3a is slightly bent to protrude upward in the Y-direction as a drive direction of the actuator 3 or is slightly curved to entirely expand upward in the Y-direction.

The actuator 3 is a thermal actuator configured to thermally expand by heating by power distribution to generate drive force. Moreover, as described above, the actuator 3 is bent or curved in the drive direction thereof, and therefore, upon thermal expansion by heating, the actuator 3 is not bent or curved to the opposite side of the drive direction. Thus, the actuator 3 can be reliably bent or curved in the drive direction.

The diverting beam 4 is in a substantially U-shape opening on the lower side in the Y-direction. Of the diverting beam 4, a substantially intermediate portion of a portion extending in the X-direction is coupled to the intermediate portion 3a of the actuator 3. Moreover, a portion of the diverting beam 4 extending in the Y-direction is, at end portions thereof, coupled to the first beam 51 and the second beam 52. The diverting beam 4 has a higher stiffness than those of the first beam 51, the second beam 52, and the coupling portion 53. In the present embodiment, the diverting beam 4 is formed wide. Thus, the shape of the diverting beam 4 is held with almost no elastic deformation upon drive of the actuator 3 as described later, and transmits the drive force of the actuator 3 to the first beam 51 and the second beam 52. Note that for increasing the stiffness of the diverting beam 4 as compared to those of the first beam 51, the second beam 52, and the coupling portion 53, the thickness of the diverting beam 4 may be increased as compared to those of the first beam 51, the second beam 52, and the coupling portion 53, or a film of a material having a higher stiffness than that of silicon as a base material, such as a diamond-like carbon film, may be formed on part of the diverting beam 4. Moreover, although not shown in the figure, a lightening portion (hole) may be provided at the diverting beam 4. In a case where the actuator 3 is the thermal actuator as described above, a lightening structure is provided at the diverting beam 4, and in this manner, the surface area of the diverting beam 4 increases and heat dissipation is accelerated. With this configuration, heat transmitted from the actuator 3 to the mirror 6 can be reduced.

The beam 5 has the first beam 51 extending in the Y-direction, and the second beam 52 arranged facing the first beam 51 through the mirror 6 and extending in the Y-direction. The first beam 51 and the second beam 52 are arranged substantially parallel to an upper surface of the substrate 200.

The first beam 51 has an upper first beam 51a, a lower first beam 51b, and the folded-back portions 54. The first end portion 5a of the upper first beam 51a is coupled to one end portion of the diverting beam 4, and a second end portion 5b of the upper first beam 51a is coupled to one end portion of the coupling portion 53 through the folded-back portion 54. A third end portion 5c of the lower first beam 51b is coupled to one end portion of the coupling portion 53 through the folded-back portion 54, and the fourth end portion 5d of the lower first beam 51b is coupled to the third base member 23. That is, the first beam 51 is coupled to the actuator 3 through the diverting beam 4, and after having extended parallel to the upper surface of the substrate 200, is folded back to the lower side in the Z-direction at the folded-back portions 54 and is coupled to the fixing portion 2. The upper first beam 51a and the lower first beam 51b are both rod-shaped members having a substantially constant width extending in the Y-direction, and the width of the upper first beam 51a and the width of the lower first beam 51b are substantially equal to each other. Moreover, as viewed in plane, the upper first beam 51a and the lower first beam 51b are arranged in parallel with a predetermined spacing in the X-direction. Further, as illustrated in FIG. 2, the upper first beam 51a and the lower first beam 51b are arranged in parallel with a predetermined spacing in the Z-direction. The thickness of the upper first beam 51a and the thickness of the lower first beam 51b are substantially equal to each other. Both ends of the upper first beam 51a are the first end portion 5a and the second end portion 5b of the first beam 51, and both ends of the lower first beam 51b are the third end portion 5c and the fourth end portion 5d of the first beam 51.

The second beam 52 has an upper second beam 52a, a lower second beam 52b, and the folded-back portion 54. The first end portion 5a of the upper second beam 52a is coupled to the other end portion of the diverting beam 4, and a second end portion 5b of the upper second beam 52a is coupled to the other end portion of the coupling portion 53 through the folded-back portion 54. A third end portion 5c of the lower second beam 52b is coupled to the other end portion of the coupling portion 53 through the folded-back portion 54, and the fourth end portion 5d of the lower second beam 52b is coupled to the third base member 23. That is, the second beam 52 is coupled to the actuator 3 through the diverting beam 4, and after having extended parallel to the upper surface of the substrate 200, is folded back to the lower side in the Z-direction at the folded-back portion 54 and is coupled to the fixing portion 2. The upper second beam 52a and the lower second beam 52b are both rod-shaped members having a substantially constant width extending in the Y-direction, and the width of the upper second beam 52a and the width of the lower second beam 52b are substantially equal to each other. Moreover, as viewed in plane, the upper second beam 52a and the lower second beam 52b are arranged in parallel with a predetermined spacing in the X-direction. Further, as illustrated in FIG. 2, the upper second beam 52a and the lower second beam 52b are arranged in parallel with a predetermined spacing in the Z-direction. The thickness of the upper second beam 52a and the thickness of the lower second beam 52b are substantially equal to each other. Both ends of the upper second beam 52a are the first end portion 5a and the second end portion 5b of the second beam 52, and both ends of the lower second beam 52b are the third end portion 5c and the fourth end portion 5d of the second beam 52. Moreover, the first end portions 5a and the second end portions 5b of the upper first and second beams 51a, 52a are coupled to the vicinity of upper surfaces of the diverting beam 4 and the coupling portion 53, and the third end portions 5c and the fourth end portions 5d of the lower first and second beams 51b, 52b are coupled to the vicinity of a lower surface of the first silicon layer 210 of the coupling portion 53 and the third base member 23.

Moreover, the first beam 51 and the second beam 52 are arranged symmetrically with respect to the mirror 6 in the X-direction, and the mirror 6 is not driven in a twisted state upon drive of the mirror apparatus 1 as described later.

The coupling portion 53 is a rod-shaped member having a substantially constant width extending in the X-direction, and couples the first beam 51 and the second beam 52 to each other. Moreover, the folded-back portions 54 of the first beam 51 and the second beam 52 are each coupled to both end portions of the coupling portion 53. The coupling portion 53 is the movement portion configured to tilt with respect to the upper surface of the substrate 200 by drive of the actuator 3.

The mirror 6 is a flat plate member arranged at the substantially center of the opening 20A, coupled to the intermediate portion, and having a substantially circular shape as viewed in plane. The mirror 6 is the movement portion configured to tilt with respect to the upper surface of the substrate 200 by drive of the actuator 3. Moreover, in the mirror apparatus 1, the mirror 6 functions as a mirror configured to reflect not-shown incident light and change an optical path of such light. Thus, the mirror 6 has a planar shape slightly larger than the section of the optical path. Moreover, a metal film 61 such as an Au/Ti film is formed across the entirety of a front surface of the mirror 6. Note that in a case where light enters the substrate 200 through a front surface thereof, the metal film 61 is provided on the front surface of the mirror 6. However, in a case where light enters the substrate 200 through a back surface thereof, the metal film 61 is provided on a back surface of the mirror 6. Moreover, in the configuration illustrated in FIG. 2, the thickness of the mirror 6 is substantially equal to the thickness of the first silicon layer 210 of the fixing portion 21, 22 and the thickness of the diverting beam 4. However, the mirror 6 is formed thinly to have the thickness substantially equal to those of the lower first and second beams 51$b$, 52$b$ so that the mass of the mirror 6 can be decreased and a resonance frequency can be increased, for example. Note that in the configuration illustrated in FIG. 1, the mirror 6 is directly coupled to the intermediate portion of the coupling portion 53, but may be coupled through a hinge, for example.

[Operation of Mirror Apparatus]

Figure 3:
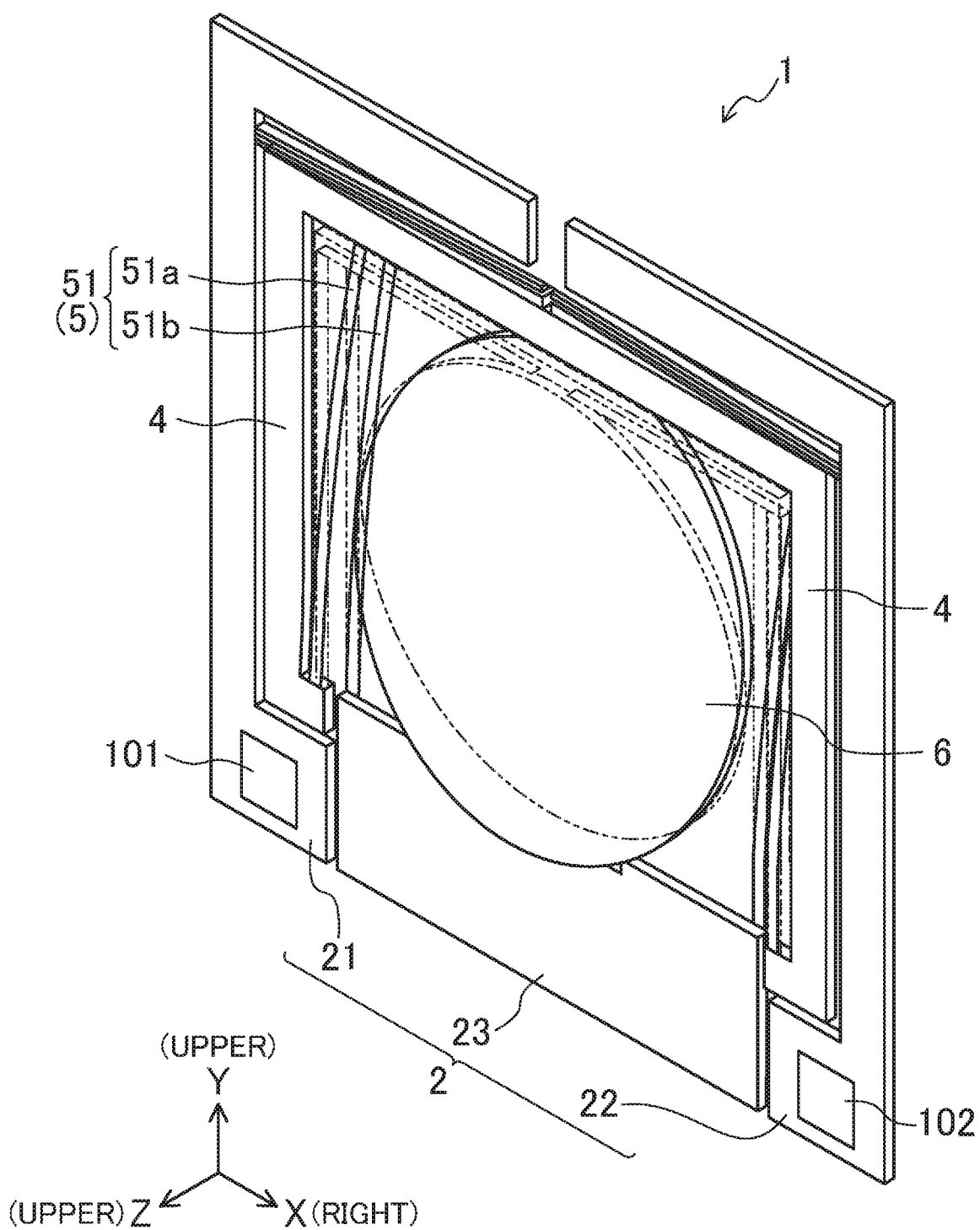
FIG. 3 is a perspective view of the mirror apparatus according to the first embodiment before and after drive.
Figure 4:
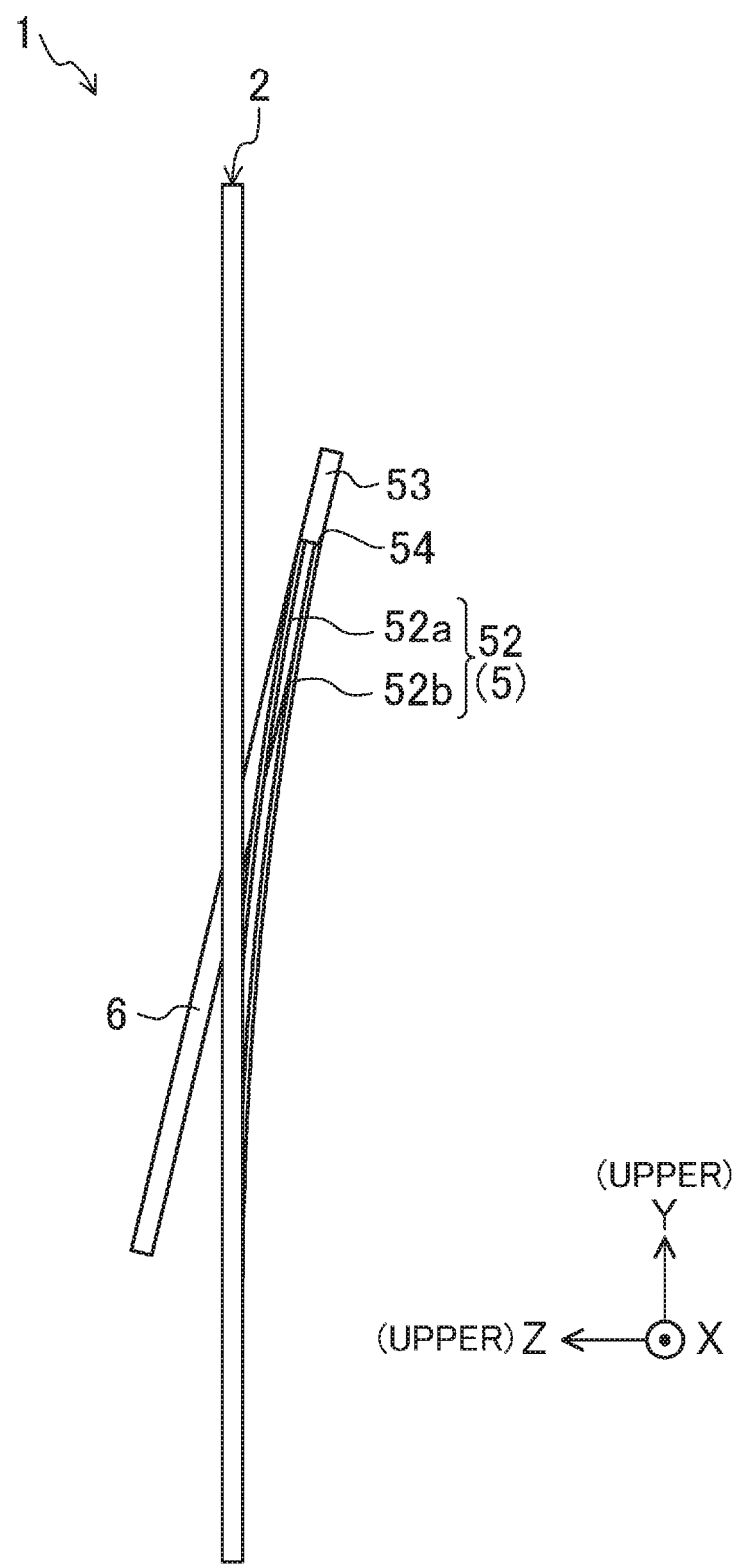
FIG. 4 is a side view of the mirror apparatus after drive.

Subsequently, operation of the mirror apparatus 1 configured as described above will be described. FIG. 3 illustrates a perspective view of the mirror apparatus 1 before and after drive, and FIG. 4 illustrates a side view of the mirror apparatus 1 after drive. Note that a chain double-dashed line in FIG. 3 indicates the mirror apparatus 1 in a state before drive. Moreover, for the sake of convenience in description, only the first silicon layer 210 is illustrated for each member.

The mirror apparatus 1 is driven by voltage application to between the first electrode 101 and the second electrode 102. When voltage is applied to between the first electrode 101 and the second electrode 102, current flows in the actuator 3 through the first base member 21 and the second base member 22. At this point, Joule heat is generated at the actuator 3 made of a silicon material, and the actuator 3 is heated to about 400° C. in a moment.

By heating, the actuator 3 thermally expands such that the entire length thereof is stretched. The positions of the first end portions 3$b$ and the second end portions 3$c$ of the actuator 3 are fixed by the fixing portion 2, and these end portions are not movable. Thus, by thermal expansion of the actuator 3, the intermediate portion 3$a$ is pushed upward in the Y-direction as a direction in which the intermediate portion 3$a$ protrudes in advance.

When the intermediate portion 3$a$ of the actuator 3 is pushed upward in the Y-direction, the diverting beam 4 coupled thereto is pulled upward in the Y-direction, but almost no elastic deformation of the diverting beam 4 is caused. Thus, the force of pulling the diverting beam 4 upward in the Y-direction acts to push the upper first beam 51$a$ and the upper second beam 52$a$ coupled to the diverting beam 4 upward from the first end portions 5$a$ in the Y-direction.

When the upper first beam 51$a$ and the upper second beam 52$a$ are pushed upward in the Y-direction, Y-direction upward push force acts on the upper side of the folded-back portions 54 coupled to the second end portions 5$b$ of the upper first beam 51$a$ and the upper second beam 52$a$. Meanwhile, the folded-back portions 54 are coupled to the fixing portion 2 (the third base member 23) through the lower first beam 51$b$ and the lower second beam 52$b$. Thus, the lower first beam 51$b$ and the lower second beam 52$b$ are not displaced in the Y-direction, and the force of pulling the lower side of the folded-back portions 54 downward in the Y-direction acts on the third end portions 5$c$. The above-described force acts on the upper and lower sides of the folded-back portions 54, and therefore, the folded-back portions 54 are driven downward in the Z-direction. At this point, the first beam 51 and the second beam 52 are greatly curved downward in the Z-direction about pivot points which are the first end portions 5$a$ and the fourth end portions 5$d$. According to curve of the first beam 51 and the second beam 52, the coupling portion 53 coupled to the folded-back portions 54 tilts clockwise as illustrated in FIG. 4.

In association with tilting of the coupling portion 53, the mirror 6 coupled to the coupling portion 53 also tilts clockwise. Of a portion of the mirror 6 coupled to the coupling portion 53, the opposite side in the Y-direction is not coupled to any member, and is freely movable at this point. Moreover, as illustrated in FIGS. 1, 3, and 4, the lengths of the first and second beams 51, 52 in the Y-direction and the length of the mirror 6 in the Y-direction, i.e., the diameter of the mirror 6, are substantially equal to each other. Thus, the mirror 6 tilts about an axis (not shown) passing through a point apart from the portion coupled to the coupling portion 53 in the Y-direction by a radius, i.e., the substantially center of the mirror 6, and extending in the X-direction. The tilting angle of the mirror 6 illustrated in FIG. 4 is about 3°, and at this point, the voltage applied to between the first electrode 101 and the second electrode 102 is about several V. For obtaining the same tilting angle, a drive voltage can be decreased by about ½ to a single digit as compared to the case of driving a piezoelectric drive actuator to directly tilt the mirror 6 in the Z-direction.

As described above, voltage application (a drive state of the mirror apparatus 1) to the first electrode 101 and the second electrode 102 and cancellation (a non-drive state of the mirror apparatus 1) of such voltage application are switched so that the mirror 6 can be tilted in a direction crossing the surface of the mirror 6. The not-shown optical path is arranged to overlap with the mirror 6 illustrated in FIG. 1. The mirror 6 tilts as illustrated in FIGS. 3 and 4 to reflect light passing through the not-shown optical path and emit the light to the outside of the mirror apparatus 1 with the optical path being different from an original optical path.

[Method for Manufacturing Mirror Apparatus]

Figure 5:
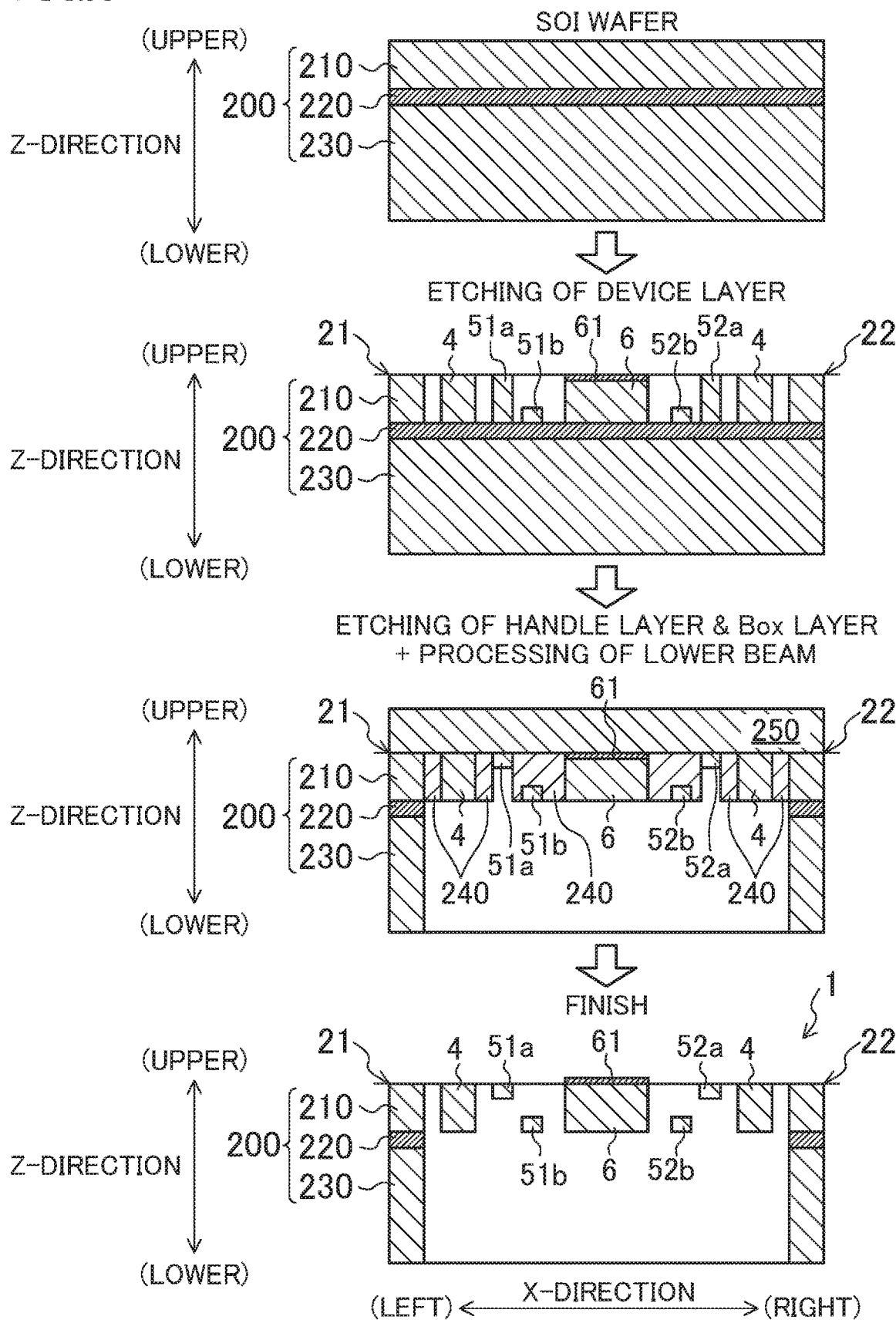
FIG. 5 is a view of the steps of manufacturing the mirror apparatus.

Subsequently, the method for manufacturing the mirror apparatus 1 will be described. FIG. 5 illustrates the steps of manufacturing the mirror apparatus 1 according to the present embodiment. Note that each manufacturing step view illustrated in FIG. 5 corresponds to the sectional view along the II-II line of FIG. 1.

First, a SOI wafer (the SOI substrate 200) including the device layer (the first silicon layer 210), the Box layer (the oxide layer 220), and the handle layer (the second silicon layer 230) is prepared. For example, the thickness of the device layer is 30 µm, the thickness of the Box layer is 1 µm, and the thickness of the handle layer is 250 µm.

The device layer is etched to integrally form, in the device layer, the displacement enlarging mechanism including the fixing portion 2, the actuator 3 (not shown), the diverting beam 4, the upper first beam 51a, the lower first beam 51b, the upper second beam 52a, the lower second beam 52b, the coupling portion 53 (not shown), and the mirror 6. Note that for the sake of convenience, only part of the displacement enlarging mechanism is illustrated in FIG. 5.

Particularly, the number of times of etching for the lower first beam 51b and the lower second beam 52b is increased by one as compared to that for other members, and the lower first beam 51b and the lower second beam 52b are thinly formed with a thickness of several µm. That is, the thicknesses of the lower first beam 51b and the lower second beam 52b are smaller than those of the actuator 3, the diverting beam 4, the folded-back portion 54, and the mirror 6. Further, the first electrode 101 (not shown) is formed on a front surface of the first base member 21, the second electrode 102 (not shown) is formed on a front surface of the second base member 22, and the metal film 61 is formed on the front surface of the mirror 6. The electrodes 101, 102 and the metal film 61 are, for example, Au/Ti films having a Ti thickness of 20 nm and an Au thickness of 300 nm.

When the original shape of the mirror apparatus 1 is formed in the device layer, a dummy wafer 250 is subsequently bonded to the device layer with wax 240, and back layers, i.e., the Box layer and the handle layer, of the mirror apparatus 1 are etched. Further, a not-shown mask is provided on the back side of the mirror apparatus 1 such that portions corresponding to the upper first beam 51a and the upper second beam 52a open, and the first silicon layer of these corresponding portions is removed from the back side. At this point, etching is performed such that the thicknesses of the upper first beam 51a and the upper second beam 52a and the thicknesses of the lower first beam 51b and the lower second beam 52b are substantially equal to each other. Subsequently, the not-shown mask is removed. By such etching, the SOI substrate 200 remains in the fixing portion 2, and only the device layer remains in the actuator 3 (not shown), the diverting beam 4, the upper first beam 51a, the lower first beam 51b, the upper second beam 52a, the lower second beam 52b, the coupling portion 53 (not shown), and the mirror 6 as other movable members of the displacement enlarging mechanism.

Finally, the wax 240 and the dummy wafer 250 are removed to bring the mirror apparatus 1 to completion. The well-known steps of manufacturing a micro electro-mechanical systems (MEMS) element are applied as the above-described steps. Particularly, processing is easily performed with a predetermined spacing being held in the Z-direction in the upper first and second beams 51a, 52a and the lower first and second beams 51b, 52b. Moreover, arrangement interval accuracy of these beams in the X-direction and the Z-direction can be improved.

Advantageous Effects

According to the above-described displacement enlarging mechanism, the actuator 3 thermally expands by heating by power distribution, and in this manner, the diverting beam 4 is driven to drive the first and second beams 51, 52 coupled to the diverting beam 4. In the first and second beams 51, 52, drive is performed such that the upper first and second beams 51a, 52a push the folded-back portions 54 and the lower first and second beams 51b, 52b pull the folded-back portions 54. Thus, the first and second beams 51, 52 coupled to the folded-back portions 54 are greatly curved, and the coupling portion 53 coupled to the folded-back portions 54 is tilted. Further, the mirror 6 coupled to the coupling portion 53 tilts. That is, the actuator 3 as a drive member is slightly displaced in a direction parallel to the surface of the mirror 6, and therefore, the mirror 6 can be greatly tilted. Moreover, the first beam 51 and the second beam 52 are arranged symmetrically with respect to the mirror 6 in the X-direction, and the mirror 6 is not driven in the twisted state upon drive of the mirror apparatus 1. Thus, the mirror 6 can be tilted in a predetermined direction.

Moreover, the lengths of the first and second beams 51, 52 and the diameter of the mirror 6 are substantially equal to each other, and therefore, the mirror 6 can be tilted about the axis passing through the substantially center of the mirror 6.

Note that in the present embodiment, the example where the thermal actuator is used as the actuator 3 has been described. However, an actuator to be driven by another method, such as a capacitance drive actuator or a piezoelectric drive actuator, may be used. Since the thermal actuator is used as the actuator 3, a great amount of tilting of the mirror 6 is obtained. Thus, even when the voltage applied to between the first electrode 101 and the second electrode 102 is low, the mirror 6 can be sufficiently tilted. With this configuration, a large irradiation area of reflected light by the mirror 6 can be obtained. Moreover, since the thermal actuator is used, age deterioration of the actuator itself is reduced and the life of the mirror apparatus 1 is increased as compared to the piezoelectric drive actuator. Further, in the present embodiment, the configuration in which the fourth end portions 5d of the lower first and second beams 51b, 52b are coupled to the third base member 23 of the fixing portion 2 has been described. However, the fourth end portions 5d may be coupled to each other through not-shown another coupling portion. Alternatively, not-shown another actuator may be coupled to the another coupling portion, and the first and second beams 51, 52 may be driven by the actuator 3 and the another actuator. In this case, bending (curving) directions of the actuator 3 and the not-shown another actuator are opposite to each other. Specifically, in the state before drive, the actuator 3 is bent or curved downward in the Y-direction, and the another actuator is bent or curved upward in the Y-direction.

Second Embodiment

[Configuration of Mirror Apparatus]

Figure 6:
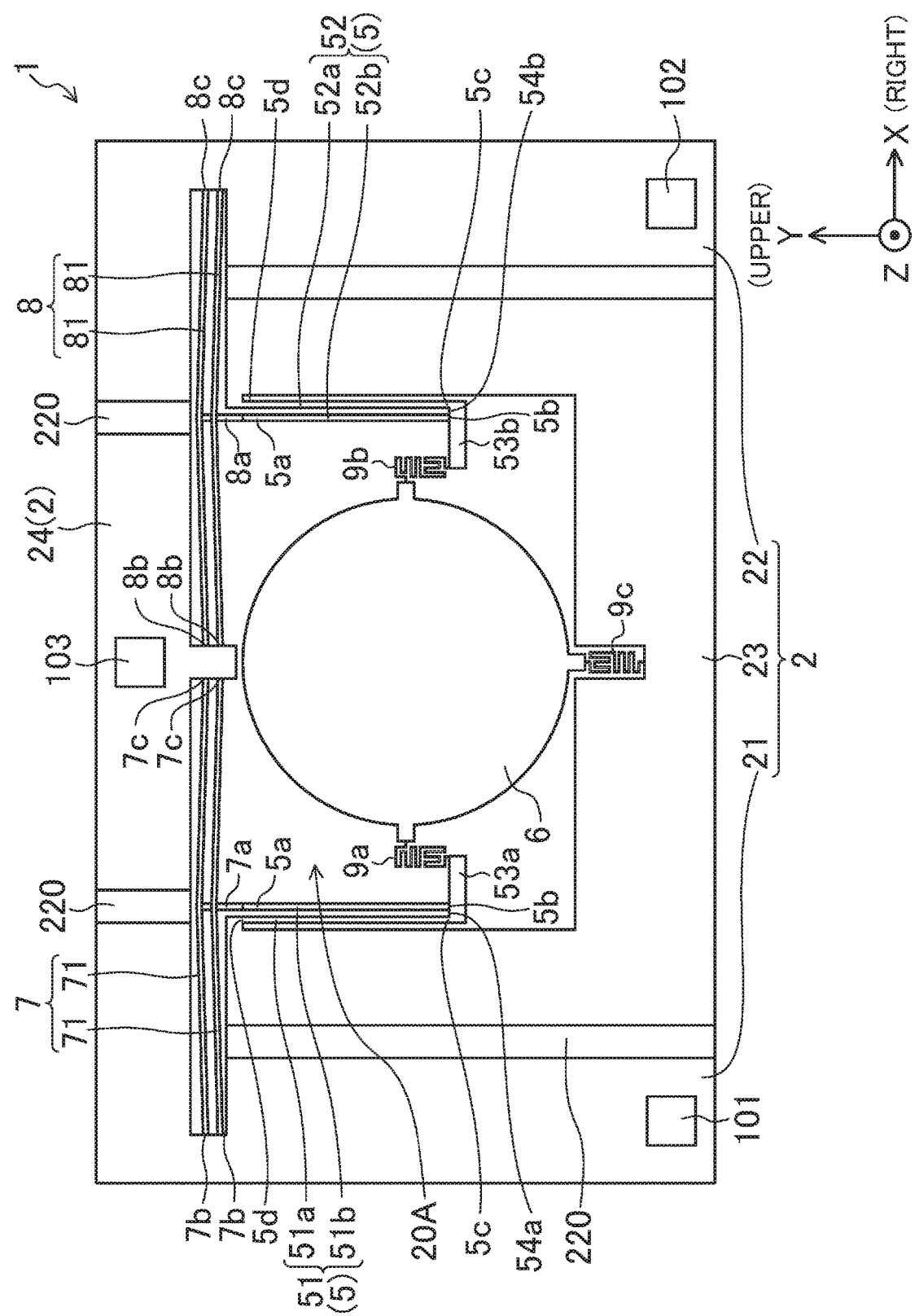
FIG. 6 is a plan view of a mirror apparatus according to a second embodiment.

FIG. 6 illustrates a plan view of a mirror apparatus 1 according to the present embodiment. A first difference between the present embodiment and the mirror apparatus 1 illustrated in FIG. 1 is that a first actuator 7 configured to drive a first beam 51 and a second actuator 8 configured to drive a second beam 52 are separately provided.

The first actuator 7 includes two actuators 71 arranged in parallel. Two actuators 71 are rod-shaped drive beams extending in the X-direction, and are coupled to each other at an intermediate portion 7a at the substantially center from a first end portion 7b to a second end portion 7c of the first actuator 7 in a longitudinal direction thereof. A curving or bending direction of two actuators 71 is similar to that of the actuator 3 described in the first embodiment, and as in the actuator 3 described in the first embodiment, drive force of the actuators 71 is combined such that the first actuator 7 provides great drive force.

The first end portions 7b of two actuators 71 are coupled to a first base member 21. The second end portions 7c of two actuators 71 are coupled to a fourth base member 24 provided between the first base member 21 and a second base member 22. In the mirror apparatus 1 according to the present embodiment, a fixing portion 2 includes the first to fourth base members 21 to 24. As in the configuration described in the first embodiment, the third base member 23 is provided between the first base member 21 and the second base member 22 on the lower side in the Y-direction. On the other hand, the fourth base member 24 is provided between the first base member 21 and the second base member 22 on the upper side in the Y-direction. Moreover, a third electrode 103 is provided at the fourth base member 24, and functions as a common electrode for the first actuator 7 and the second actuator 8.

Moreover, the first actuator 7 does not extend straight in the X-direction, and the intermediate portion 7a is slightly bent to protrude upward in the Y-direction as a drive direction of the first actuator 7 or is slightly curved to entirely expand upward in the Y-direction.

The second actuator 8 includes two actuators 81 arranged in parallel. Two actuators 81 are rod-shaped drive beams extending in the X-direction, and are coupled to each other at an intermediate portion 8a at the substantially center from a first end portion 8b to a second end portion 8c of the second actuator 8 in a longitudinal direction thereof. A curving or bending direction of two actuators 81 is similar to that of the first actuator 7, and as in the first actuator 7, drive force of the actuators 81 is combined such that the second actuator 8 provides great drive force.

The first end portions 8b of two actuators 81 are coupled to the fourth base member 24. The second end portions 8c of two actuators 81 are coupled to the second base member 22.

Moreover, the second actuator 8 does not extend straight in the X-direction, and the intermediate portion 8a is slightly bent to protrude upward in the Y-direction as a drive direction of the second actuator 8 or is slightly curved to entirely expand upward in the Y-direction. Further, the actuators 71 and the actuators 81 are set such that the X-direction lengths, the Y-direction widths, and the Z-direction thicknesses thereof are substantially equal to each other.

Next, a difference between the mirror apparatus according to the present embodiment and the mirror apparatus illustrated in FIG. 1 is that instead of the coupling portion 53 and the folded-back portions 54 illustrated in FIG. 1, the first beam 51 is separately coupled to a first coupling portion 53a through a first folded-back portion 54a and the second beam 52 is separately coupled to a second coupling portion 53b through a second folded-back portion 54b.

A first end portion 5a of the first beam 51 is coupled to the intermediate portion 7a of the first actuator 7, and a first end portion 5a of the second beam 52 is coupled to the intermediate portion 8a of the second actuator 8. Second and third end portions 5b, 5c of the first beam 51 are coupled to the first coupling portion 53a through the first folded-back portion 54a, and second and third end portions 5b, 5c of the second beam 52 are coupled to the second coupling portion 53b through the second folded-back portion 54b. Moreover, a fourth end portion 5d of the first beam 51 and a fourth end portion 5d of the second beam 52 are coupled to the third base member 23. That is, the first beam 51 is coupled to the first actuator 7, and after having extended parallel to an upper surface of a substrate 200, is folded back to the upper side in the Z-direction at the first folded-back portion 54a and is coupled to the fixing portion 2. The second beam 52 is coupled to the second actuator 8, and after having extended parallel to the upper surface of the substrate 200, is folded back to the upper side in the Z-direction at the second folded-back portion 54b and is coupled to the fixing portion 2.

The first beam 51 and the second beam 52 are arranged symmetrically with respect to a mirror 6 in the X-direction, and the first coupling portion 53a and the second coupling portion 53b are arranged symmetrically with respect to the mirror 6 in the X-direction. Moreover, the mirror 6 is coupled to the first coupling portion 53a through a hinge 9a, and is coupled to the second coupling portion 53b through a hinge 9b. Further, the mirror 6 is coupled to the third base member 23 through a hinge 9c, and the hinge 9c is positioned in the substantially middle between the hinge 9a and the hinge 9b as viewed in the X-direction. A coupling portion between the mirror 6 and the hinge 9a and a coupling portion between the mirror 6 and the hinge 9b are provided to pass through an axis passing through the substantially center of the mirror 6 and extending in the X-direction. The hinge 9a and the hinge 9b have a folded-back structure in the X-direction and a folded-back structure in the Y-direction, and are for tilting of the mirror 6 about an X-axis or a Y-axis.

In the mirror apparatus 1 according to the present embodiment, the first and second beams 51, 52 are separately driven by the separate first and second actuators 7, 8. Thus, the mirror 6 can be tilted through the first and second coupling portions 53a, 53b and the hinges 9a, 9b, and the tilting axis of the mirror 6 can be changed. Hereinafter, such a point will be described with reference to the drawings.

[Operation of Mirror Apparatus]

Figure 7:
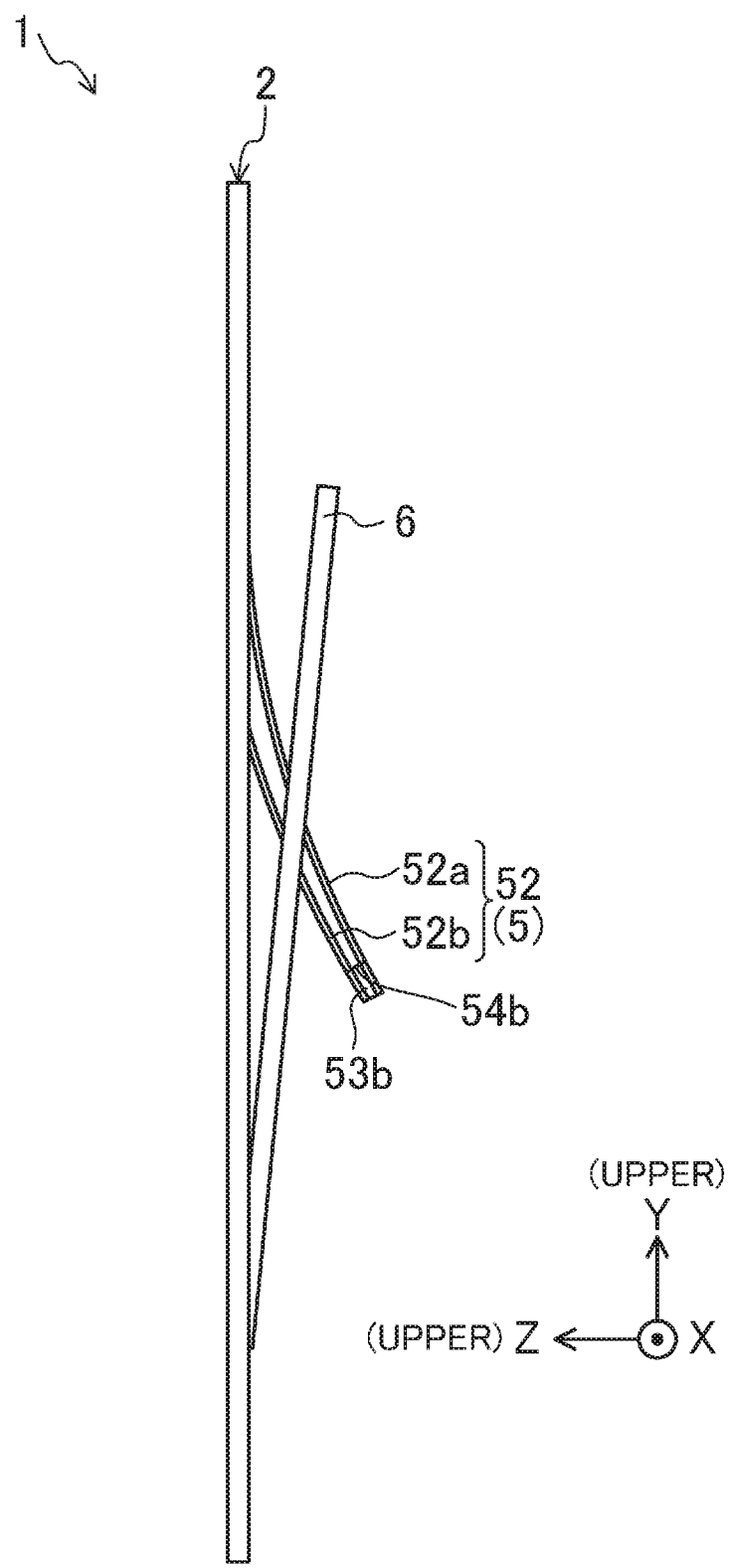
FIG. 7 is a side view of the mirror apparatus after a mirror has tilted about an X-axis.
Figure 8:
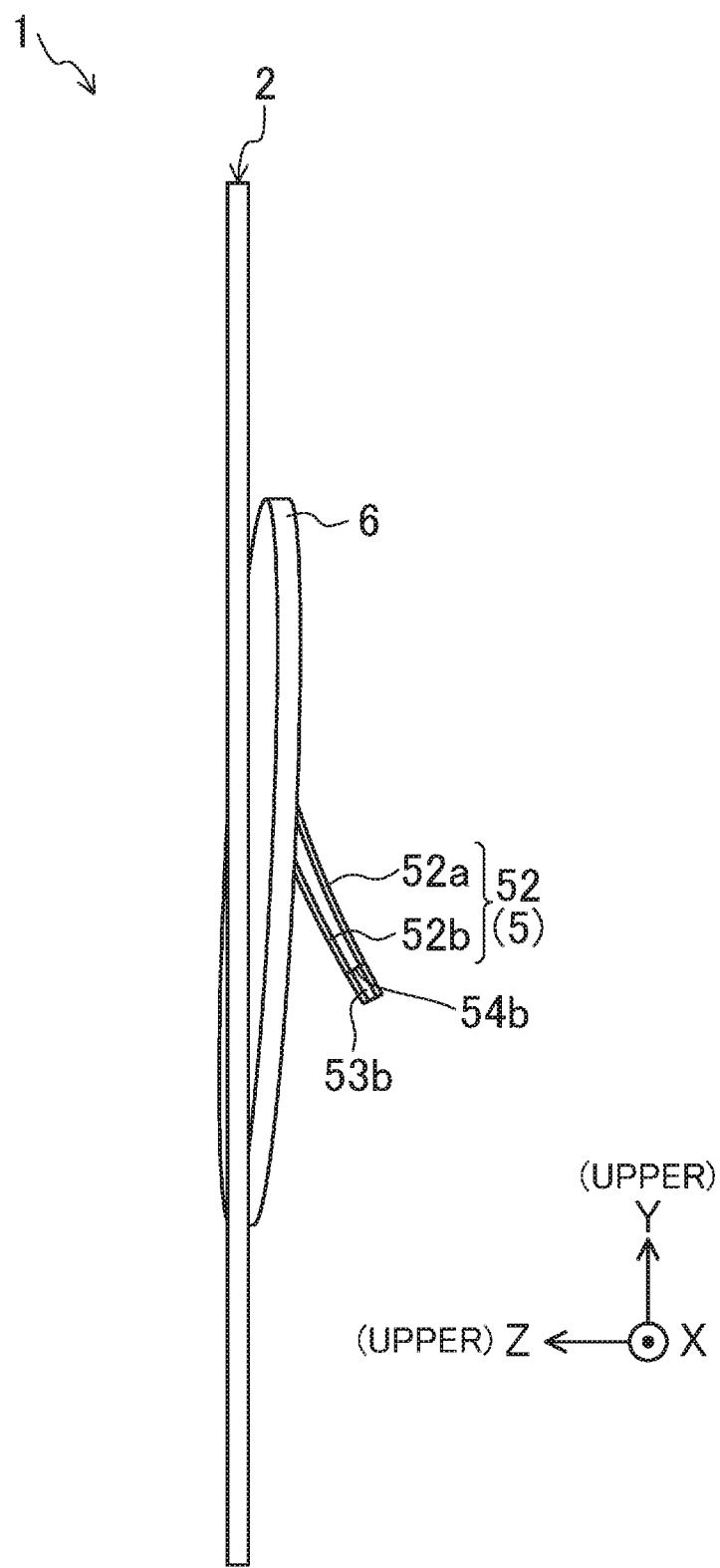
FIG. 8 is a side view of the mirror apparatus after the mirror has tilted about a Y-axis.

FIG. 7 illustrates a side view of the mirror apparatus 1 after the mirror 6 has tilted about the X-axis, and FIG. 8 illustrates a side view of the mirror apparatus 1 after the mirror 6 has tilted about the Y-axis. Note that for the sake of convenience in description, the hinges 9a to 9c are not shown in the figure. Moreover, for the sake of convenience in description, only a first silicon layer 210 is illustrated for each member.

First, the case of tilting the mirror 6 about the X-axis will be described. In this case, the same value of voltage is applied to a first electrode 101 and a second electrode 102. As described above, a third electrode 103 functions as a common electrode for the first actuator 7 and the second actuator 8. In this case, the third electrode 103 is fixed to a GND potential.

When voltage is applied to between the first electrode 101 and the third electrode 103, current flows in the first actuator 7 through the first base member 21 and the fourth base member 24, and the first actuator 7 thermally expands by heating. By thermal expansion of the first actuator 7, the intermediate portion 7a is pushed upward in the Y-direction as a direction in which the intermediate portion 7a protrudes in advance.

Similarly, when voltage is applied to between the second electrode 102 and the third electrode 103, current flows in the second actuator 8 through the second base member 22 and the fourth base member 24, and the second actuator 8 thermally expands by heating. By thermal expansion of the second actuator 8, the intermediate portion 8a is pushed upward in the Y-direction as a direction in which the intermediate portion 8a protrudes in advance.

When the intermediate portions 7a, 8a are driven, the first beam 51 (not shown) and the second beam 52 are greatly curved downward in the Z-direction according to the same principle as that described in the first embodiment, as illustrated in FIG. 7. The first coupling portion 53a (not shown) and the second coupling portion 53b tilt clockwise about the X-axis in FIG. 8. When the first and second coupling portions 53a, 53b tilt, the hinges 9a, 9b are deformed in response to such displacement, and downward force in the Z-direction acts on the coupling portion between each of the hinges 9a, 9b and the mirror 6. At this point, the same value of voltage is applied to the first electrode 101 and the second electrode 102. As described above, the actuators 71 and the actuators 81 have the substantially equal size, and therefore, when the same value of voltage is applied, the amount of flowing current and the amount of heat generation are equal among these actuators. Thus, the amounts of drive of the first and second actuators 7, 8 by thermal expansion are substantially equal to each other, and the equal downward force in the Z-direction is on the mirror 6 from the hinges 9a, 9b. The mirror 6 is coupled to the third base member 23 through the hinge 9c, and the hinge 9c is positioned in the substantially middle between the hinge 9a and the hinge 9b as viewed in the X-direction. Thus, the right side of the mirror 6 in the X-direction and the left side of the mirror 6 in the X-direction are, about the hinge 9c as a pivot point, pushed downward in the Z-direction with the substantially equal force. As a result, the mirror 6 tilts about the axis (not shown) passing through the hinge 9c and extending in the X-direction.

On the other hand, it is obvious that when different values of voltage are applied to the first electrode 101 and the second electrode 102, the drive amount is different between the first actuator 7 and the second actuator 8. Using such a point, the tilting axis of the mirror 6 can be other directions than the X-direction.

For example, when only the second actuator 8 is driven as illustrated in FIG. 8, the second beam 52 is driven, and only the second coupling portion 53b tilts. The downward force in the Z-direction acts only on the coupling portion between the hinge 9b and the mirror 6. At this point, the second beam 52 is driven without being twisted in the Z-direction, and therefore, the mirror 6 tilts about the axis extending in the Y-direction. The drive amount of the first actuator 7 and the drive amount of the second actuator 8 are separately adjusted, and therefore, the force acting on the coupling portion between the mirror 6 and the hinge 9a and the force acting on the coupling portion between the mirror 6 and the hinge 9b can be differentiated from each other. Thus, an optional axis between the axis passing through the hinge 9a, 9c and the axis extending in the X-direction can be selected as the tilting axis of the mirror 6 in an XY plane.

Note that in the present embodiment, the configuration in which the first and second actuators 7, 8 are arranged in parallel on the upper side in the Y-direction in the mirror apparatus 1 has been described, but either one of the actuators may be arranged on the lower side in the Y-direction in the mirror apparatus 1. Accordingly, arrangement of the first beam 51 or the second beam 52 is also changed. Moreover, the hinge 9c may be coupled to the opposite side of the position illustrated in FIG. 6, i.e., the fourth base member 24 of the fixing portion 2. Further, only one actuator may be provided. In this case, the actuator may be coupled only to the first beam 51 or the second beam 52, or may be coupled to both of the first beam 51 and the second beam 52.

<<Variation>>

Figure 9:
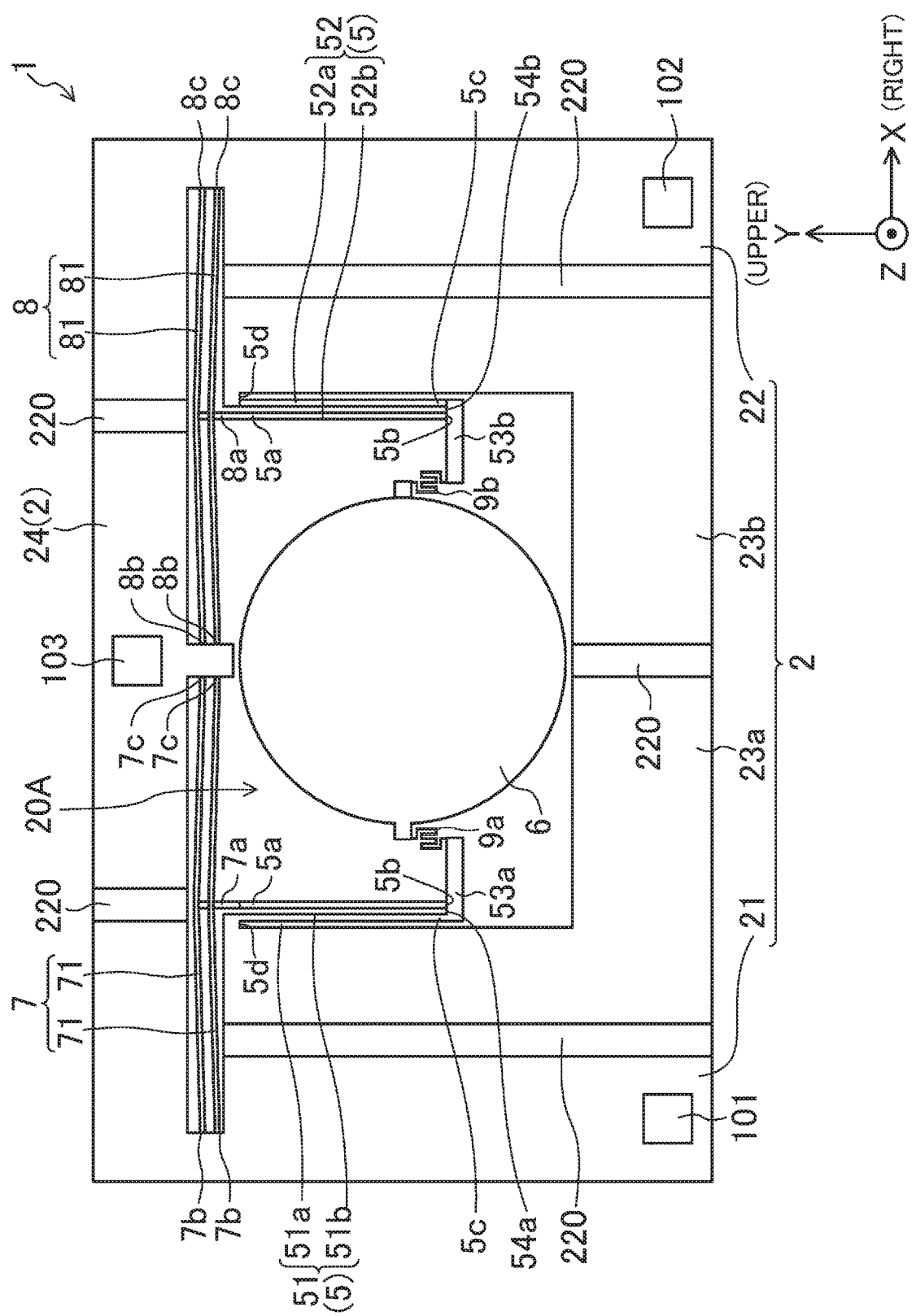
FIG. 9 is a plan view of a mirror apparatus according to a variation.
Figure 10:
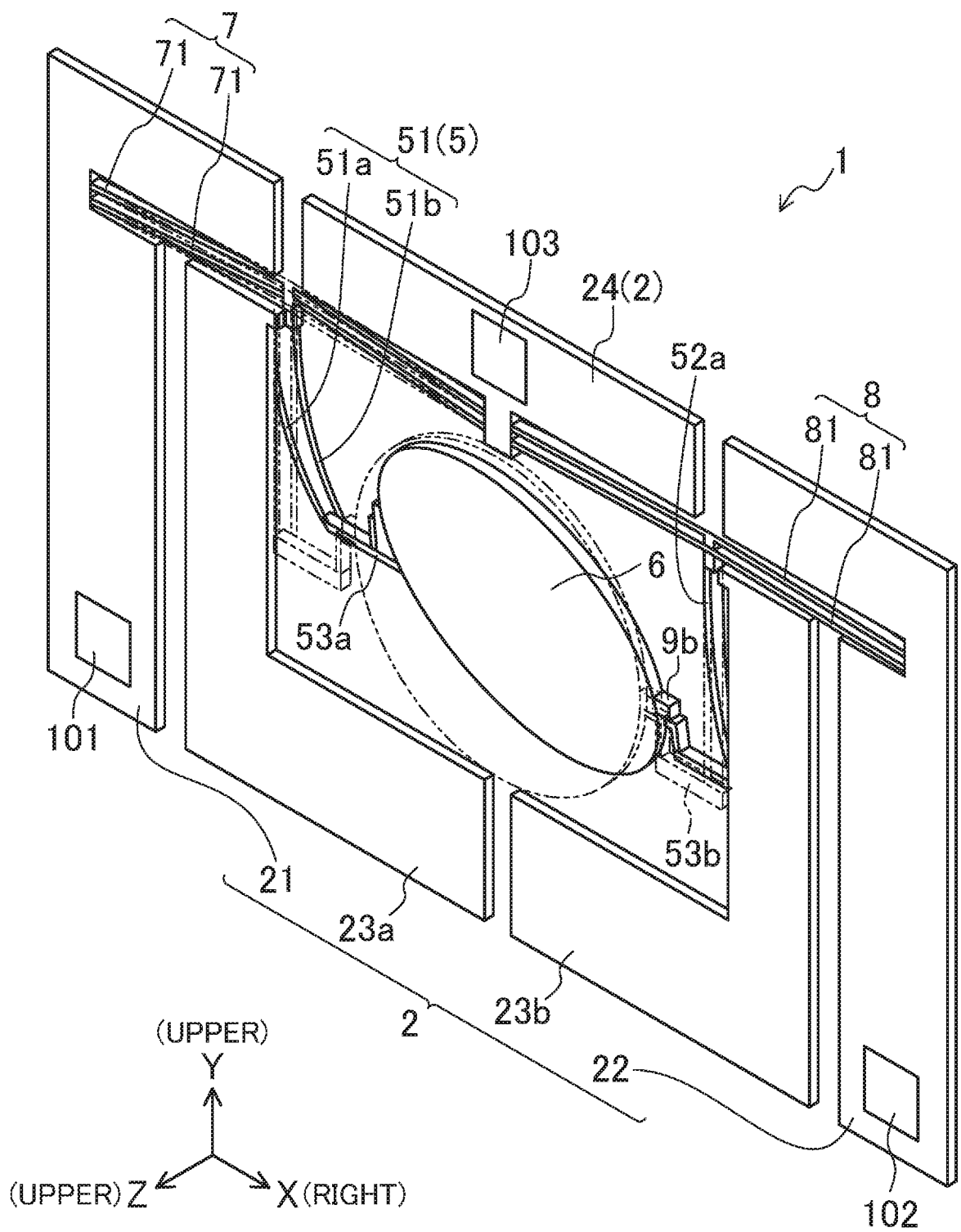
FIG. 10 is a perspective view of the mirror apparatus according to the variation before and after drive.
Figure 11:
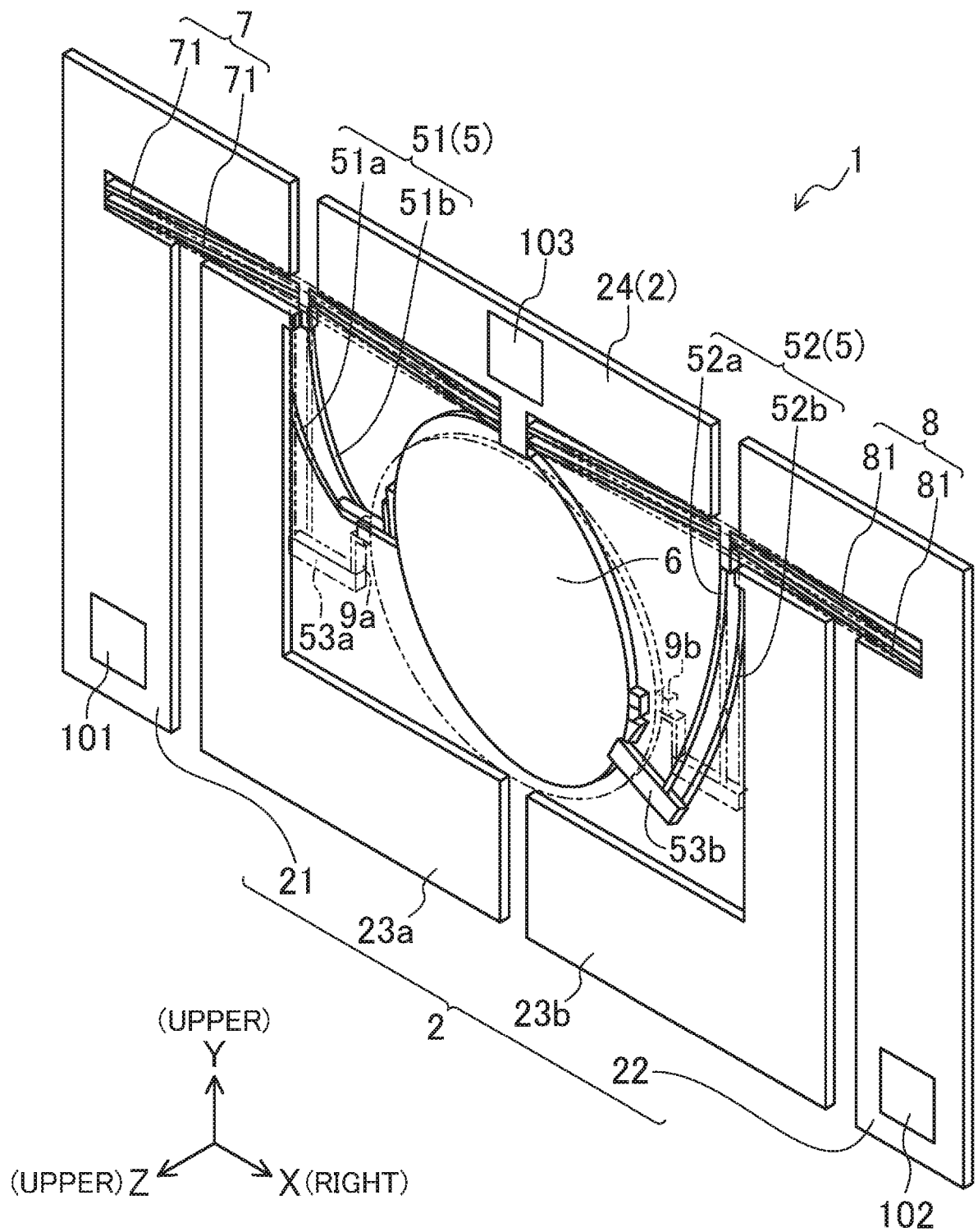
FIG. 11 is another perspective view of the mirror apparatus according to the variation before and after drive.

FIG. 9 illustrates a plan view of the mirror apparatus according to a variation, and FIGS. 10 and 11 illustrate perspective views of the mirror apparatus before and after drive. Note that chain double-dashed lines in FIGS. 10 and 11 indicate the mirror apparatus 1 in a state before drive. Moreover, in FIGS. 10 and 11, only the first silicon layer 210 is illustrated for each member for the sake of convenience in description. Further, in FIG. 11, the shapes of the hinges 9a, 9b are simplified.

A first difference between the mirror apparatus according to the present variation and the mirror apparatus according to the second embodiment is that the hinge 9c configured to couple the mirror 6 and the third base member 23 is not provided. Next, in the second beam 52, an upper second beam 52a is arranged closer to the mirror 6, and a lower second beam 52b is arranged closer to the adjacent second base member 22. In this case, both ends of the upper second beam 52a are the first end portion 5a and the second end portion 5b of the second beam 52, and both ends of the lower second beam 52b are the third end portion 5c and the fourth end portion 5d of the second beam 52. That is, the first beam 51 and the second beam 52 are not arranged symmetrically in the Y-direction. In the present variation, when the second actuator 8 is driven, the upper second beam 52a and the lower second beam 52b are curved upward in the Z-direction, the second folded-back portion 54b is driven, and the second coupling portion 53b tilts upward in the Z-direction. That is, when the first actuator 7 and the second actuator 8 are simultaneously driven, the first folded-back portion 54a and the second folded-back portion 54b are driven, and the first coupling portion 53a and the second coupling portion 53b tilt in opposite directions.

For example, when only the first actuator 7 is driven as illustrated in FIG. 10, only the upper second beam 52a tilts, and the mirror 6 tilts about the axis passing through the hinge 9b and extending in the X-direction. Moreover, when the voltage is applied to the first electrode 101 and the second electrode as illustrated in FIG. 11 to drive both of the first actuator 7 and the second actuator 8, the first coupling portion 53a and the second coupling portion 53b tilt in the opposite directions as described above. When the same voltage is applied to the first electrode 101 and the second electrode, the tilting amount of the first coupling portion 53a and the tilting amount of the second coupling portion 53b are, as overall values, substantially equal to each other. Thus, the mirror 6 tilts about the axis passing through the substantially center of the mirror 6 and extending in the Y-direction.

Note that in the present embodiment, the first actuator 7 and the second actuator 8 are independently driven. Thus, the first silicon layer 210 at an intermediate portion of the third base member 23 is removed, and therefore, the third base member 23 is separated into a third base member 23a and a third base member 23b. Thus, the first actuator 7 and the second actuator 8 are electrically separated from each other. Moreover, in the present embodiment, the configuration in which the first and second actuators 7, 8 are arranged in parallel on the upper side in the Y-direction in the mirror apparatus 1 has been described, but either one of the actuators may be arranged on the lower side in the Y-direction in the mirror apparatus 1. Accordingly, arrangement of the first beam 51 or the second beam 52 is also changed. Moreover, only one actuator may be provided. In this case, the actuator may be coupled only to the first beam 51 or the second beam 52, or may be coupled to both of the first beam 51 and the second beam 52.

Third Embodiment

Figure 12:
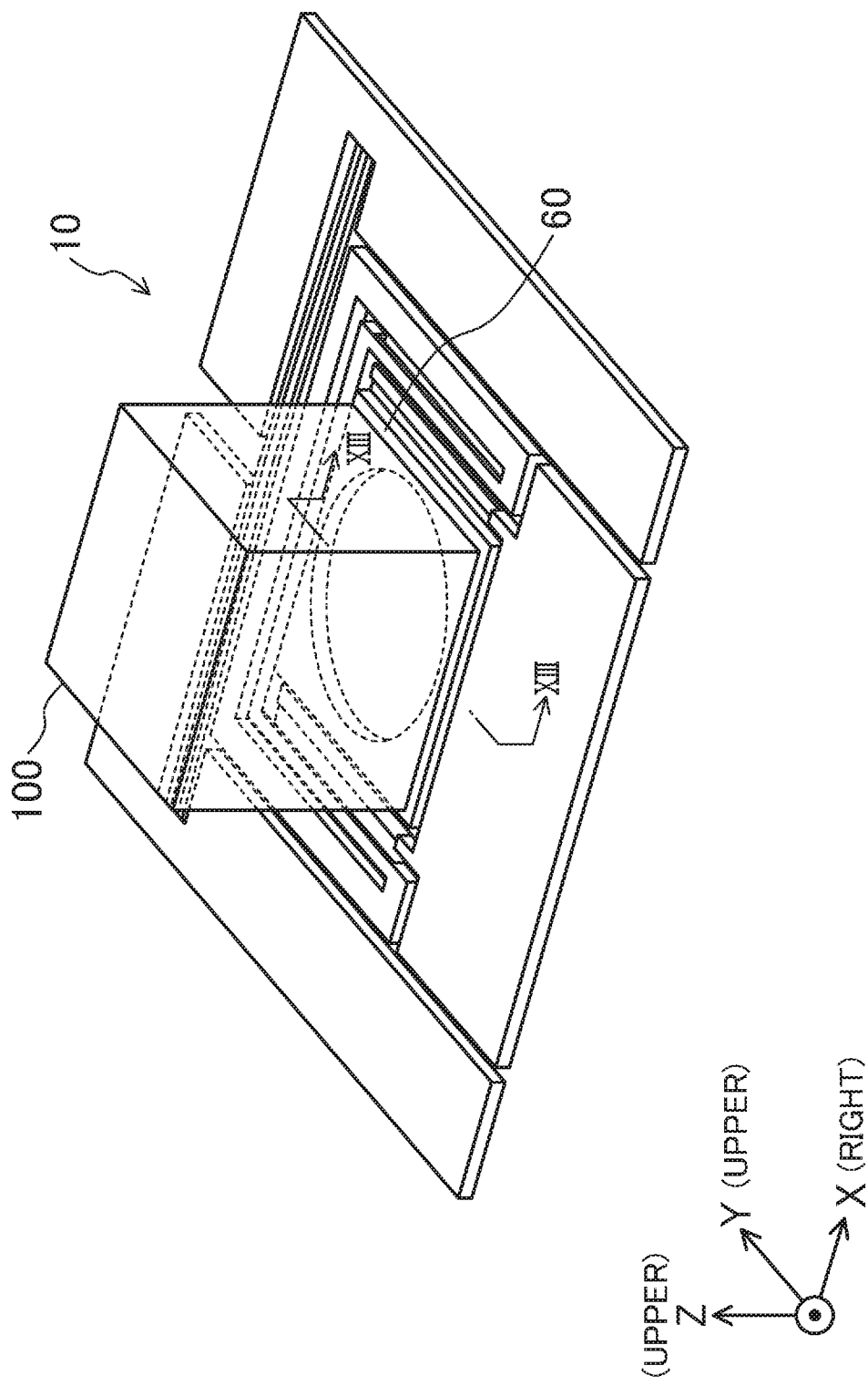
FIG. 12 is a perspective view of a wavelength selection filter apparatus according to a third embodiment.
Figure 13:
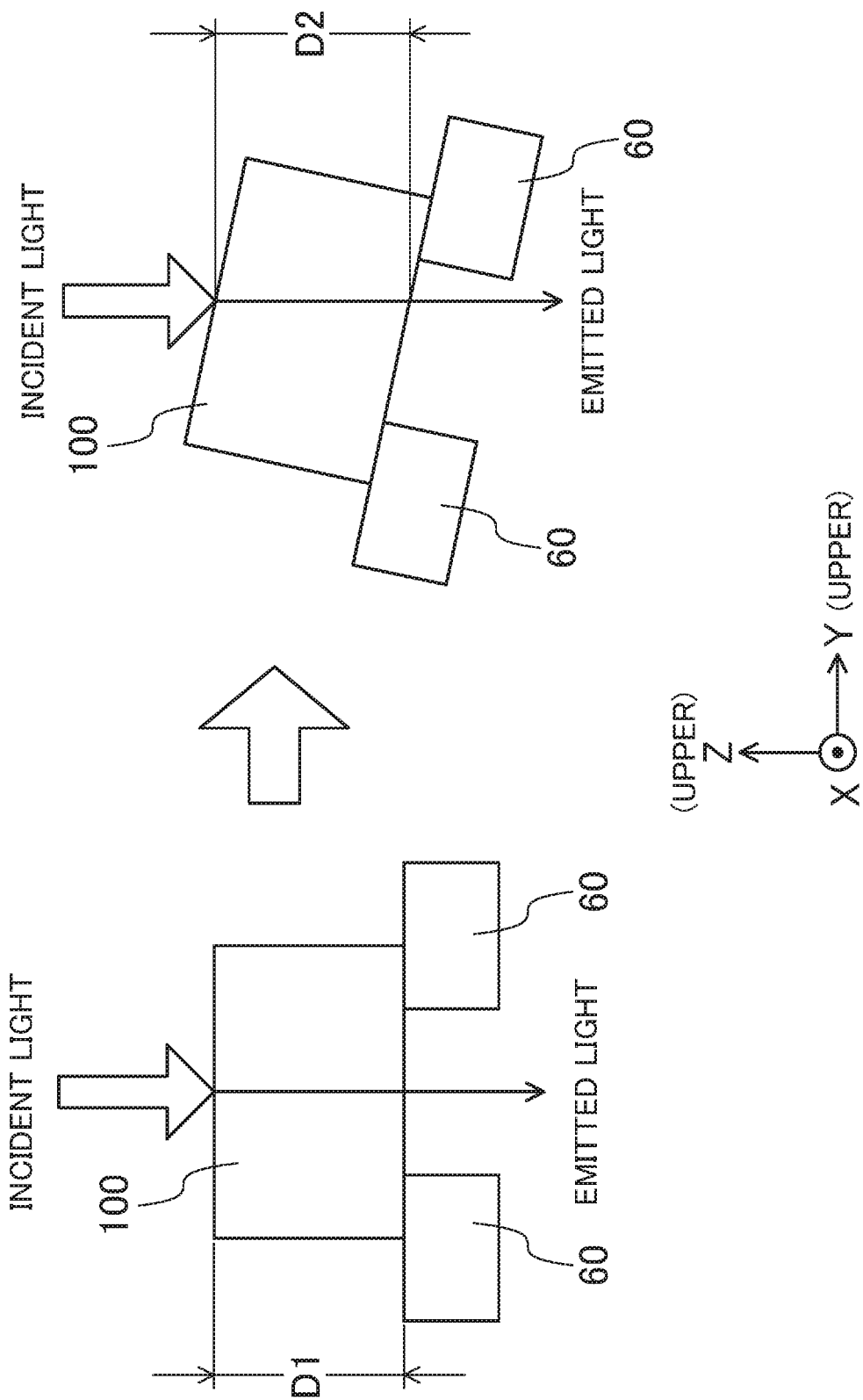
FIG. 13 is a sectional view of the state of the wavelength selection filter apparatus before and after drive along an XIII-XIII line of FIG. 12.

As described in the present embodiment, a displacement enlarging mechanism disclosed herein can be applied to a wavelength selection filter apparatus 10. FIG. 12 illustrates a perspective view of the wavelength selection filter apparatus according to the present embodiment, and FIG. 13 illustrates a sectional view along an XIII-XIII line of FIG. 12 in a state before and after drive of a wavelength selection filter. Note that in FIG. 12, only a first silicon layer 210 is illustrated for other members than a filter 100 for the sake of convenience in description.

A difference between a configuration described in the present embodiment and the configuration illustrated in FIG. 1 is that instead of a mirror 6, a filter support portion 60 is coupled to a coupling portion 53 (see FIG. 1) and the filter 100 including a dielectric multilayer film is mounted on an upper surface (an upper principal surface in the Z-direction) of the filter support portion 60. In this case, the coupling portion 53, the filter support portion 60, and the filter 100 correspond to a movement portion described in the claims. Note that other configurations than above are common to those of the configuration illustrated in FIG. 1, and therefore, description of structures, functions, and operation will be omitted.

The filter support portion 60 includes the first silicon layer 210, and is in a substantially rectangular shape as viewed in plane. An opening is provided at a center portion of the filter support portion 60. The filter 100 is mounted on the upper surface of the filter support portion 60 to cover the opening of the filter support portion 60. When an actuator 3 is driven, first and second beams 51, 52 are driven, and the coupling portion 53, the filter support portion 60, and the filter 100 tilt about an X-axis.

As illustrated in FIG. 13, in the wavelength selection filter apparatus 10, when light enters an upper surface of the filter 100, the incident light is subjected to modulation in the filter 100. The filter 100 has such a structure that dielectrics having different refractive indices are stacked on each other, and the wavelength of light penetrating the filter 100 depends on the length of the filter 100, i.e., an optical path length in the filter 100. In a case illustrated on the left side of FIG. 13, the wavelength of light penetrating the filter 100 is determined depending on the optical path length D1 in the filter 100, and light with a predetermined wavelength is emitted from a lower surface of the filter 100.

When the actuator 3 is driven and the filter support portion 60 and the filter 100 tilt about the X-axis, the optical path length in the filter 100 changes from D1 to D2 (D2>D1) as illustrated on the right side of FIG. 13. Accordingly, the wavelength of light penetrating the filter 100 also changes. Using this principle, only penetration of light with a selected wavelength is allowed in the wavelength selection filter apparatus 10. Note that in FIG. 12, the shape of the opening of the filter support portion 60 is a circular shape as viewed in plane, but the present technique is not specifically limited to above. The opening shape may be a rectangular or other shapes.

<<Second Variation>>

Figure 14:
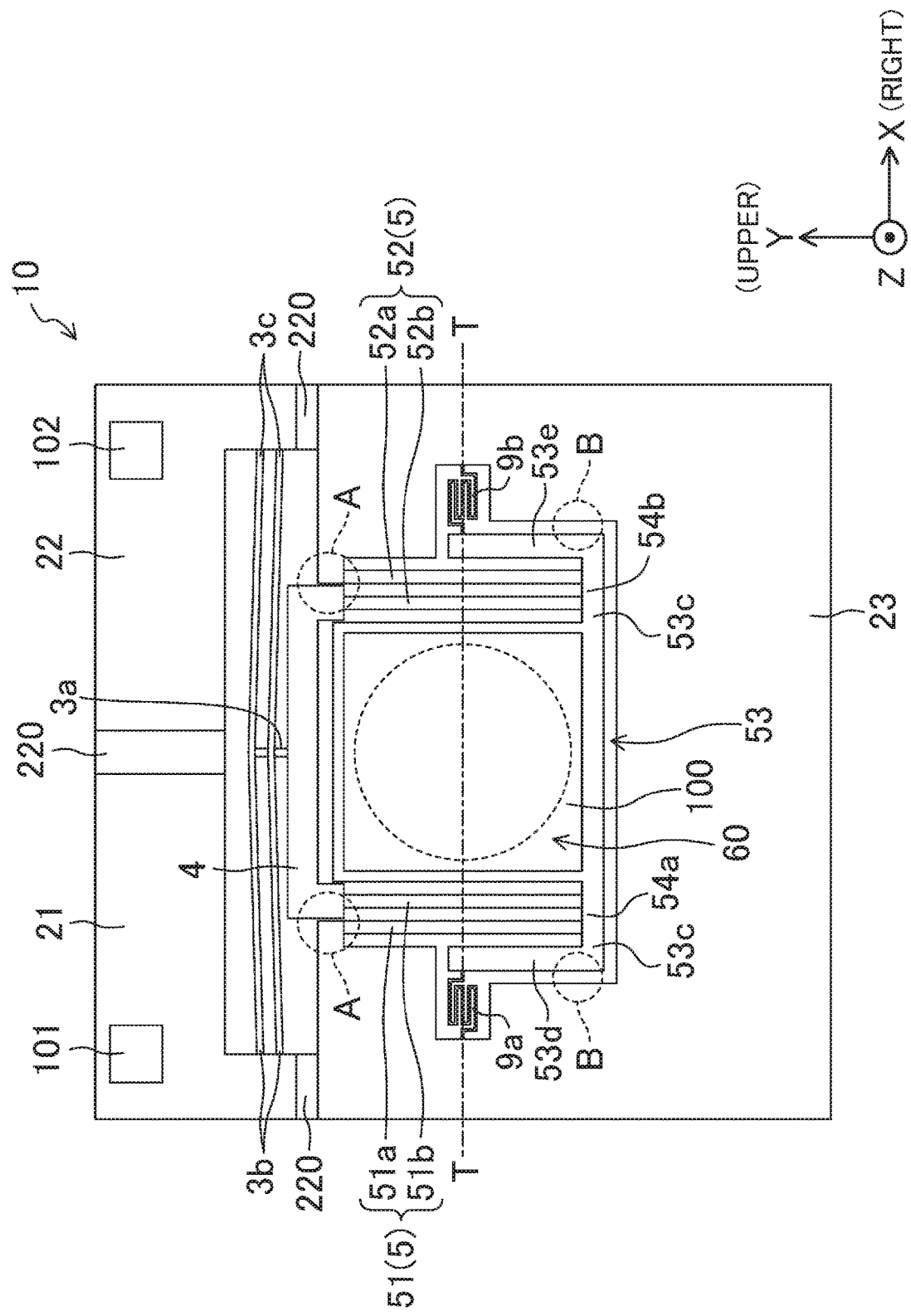
FIG. 14 is a plan view of a wavelength selection filter apparatus according to a second variation.
Figure 15:
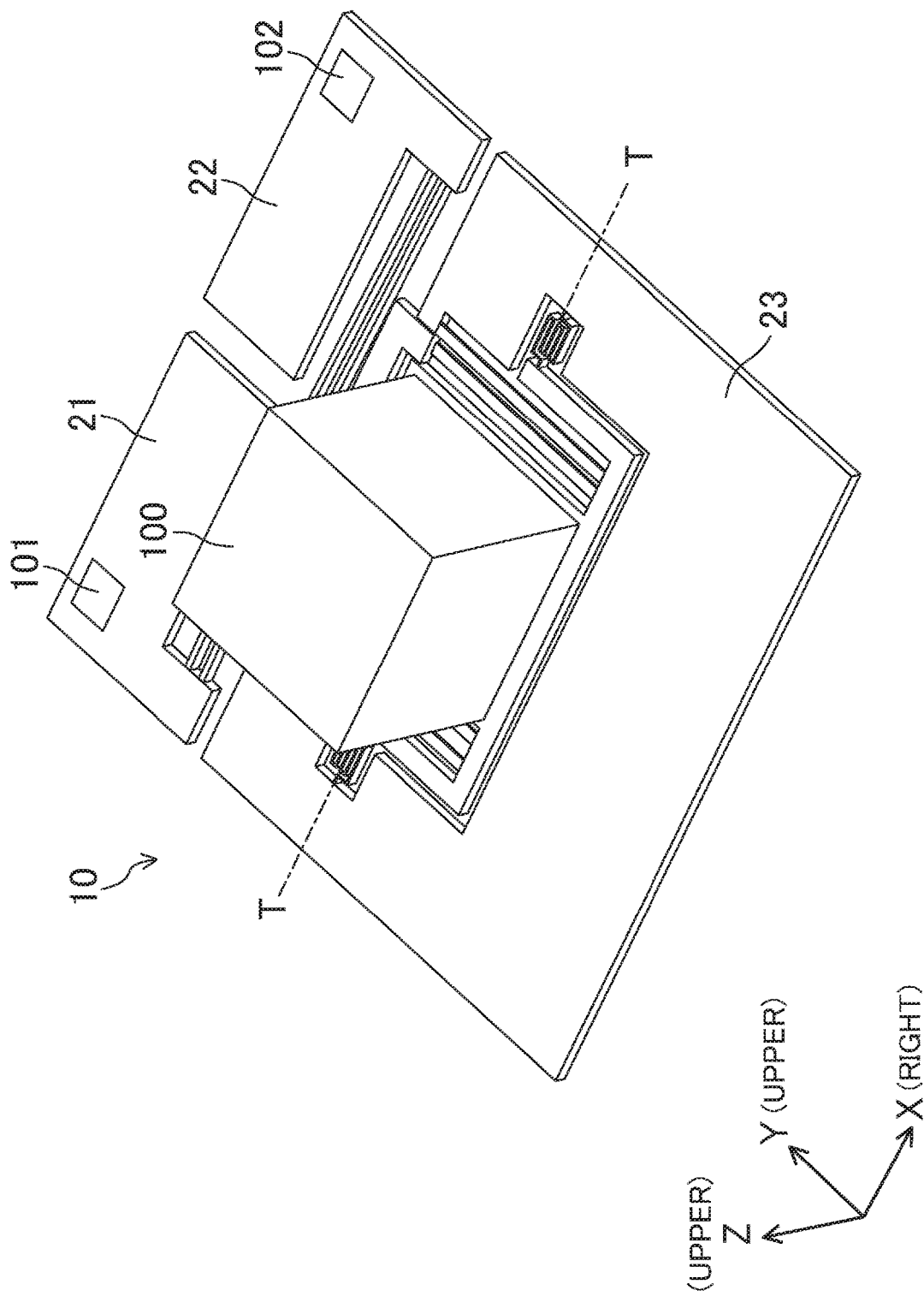
FIG. 15 is a perspective view of the wavelength selection filter apparatus according to the second variation.

FIG. 14 illustrates a plan view of the wavelength selection filter apparatus according to the present variation, and FIG. 15 illustrates a perspective view. Note that in the present variation, the same reference numerals are used to represent elements similar to those of the first to third embodiments, and detailed description thereof will be omitted. Moreover, in FIG. 15, only the first silicon layer 210 is illustrated for other members than the filter 100 for the sake of convenience in description.

A configuration described in the present variation and the configuration illustrated in FIG. 1 or 12 are different from each other in the shapes or arrangement of first to third base members 21 to 23, a diverting beam 4, and the coupling portion 53. In the configuration illustrated in FIGS. 14 and 15, in the displacement enlarging mechanism, the first base member 21 is arranged on the left side in the X-direction and the upper side in the Y-direction, and the second base member 22 is arranged on the right side in the X-direction and the upper side in the Y-direction. On the other hand, the third base member 23 is not arranged between the first and second base members 21, 22, but is arranged to surround the filter support portion 60 on the lower side of the first and second base members 21, 22 in the Y-direction.

As compared to the configuration illustrated in FIG. 1 or 12, the diverting beam 4 has a shorter portion extending in the Y-direction, and extends to the vicinity of an upper end portion of the filter support portion 60 in the Y-direction. Moreover, in the configuration illustrated in FIG. 1 or 12, an upper first beam 51a and an upper second beam 52a are coupled to the portions where the diverting beam 4 is folded back to the lower side in the Y-direction. On the other hand, in the configuration described in the present variation, the diverting beam 4 has no portion where the diverting beam 4 is folded back in the Y-direction, and at end portions of a portion extending in the Y-direction, is coupled to the upper first beam 51a and the upper second beam 52a. Moreover, the coupling portion 53 has a first portion 53c having a substantially constant width extending in the X-direction and a second portion 53d and a third portion 53e having a substantially constant width extending from both end portions of the first portion 53c in the Y-direction. The second portion 53d is, in the vicinity of an upper end portion in the Y-direction, coupled to a hinge 9a coupled to the third base member 23. Moreover, the third portion 53e is, in the vicinity of an upper end portion in the Y-direction, coupled to a hinge 9b coupled to the third base member 23. Further, a coupling portion between the second portion 53d and the hinge 9a and a coupling portion between the third portion 53e and the hinge 9b are provided to pass through an axis (hereinafter sometimes referred to as an "tilting axis T of the filter support portion 60") passing through the substantially center of the filter support portion 60 and extending in the X-direction.

The displacement enlarging mechanism is configured as described above so that the volume and mass of the diverting beam 4 can be decreased as compared to the configuration illustrated in FIG. 1 or 12. With this configuration, a greater force of pulling the diverting beam 4 upward in the Y-direction by the actuator 3 is transmitted to first and second folded-back portions 54a, 54b, and the displacement amount of the filter support portion 60 can be increased. Moreover, dissipation of heat generated at the actuator 3 from the diverting beam 4 can be reduced, and the drive amount of the actuator 3 and therefore the displacement amount of the filter support portion 60 can be increased. Further, the filter support portion 60 is coupled to a fixing portion 2 through the hinges 9a, 9b, and the hinge 9a and the hinge 9b are provided to pass through the tilting axis T. Thus, the filter support portion 60 can be tilted about the tilting axis T.

Moreover, the portion of the diverting beam 4 extending in the Y-direction is shortened. Thus, a coupling portion (corresponding to 5a illustrated in FIG. 1) between the diverting beam 4 and the beam 5, i.e., a coupling portion between the diverting beam 4 and each of the lower first beam 51b and the lower second beam 52b in this case, can be arranged on a side closer to the filter support portion 60 than the upper first beam 51a and the upper second beam 52a connected to the third base member 23 are to the filter support portion 60. With this configuration, the second and third portions 53d, 53e of the coupling portion 53 can be arranged on a side apart from the filter support portion 60 as viewed in the X-direction than the beam 5 is from the filter support portion 60, and can extend in the Y-direction. Moreover, these second and third portions 53d, 53e and the fixing portion 2 (the third base member 23) can be coupled to each other through the hinges 9a, 9b. That is, the filter support portion 60 and the coupling portion 53 (the movement portion) are coupled to the fixing portion 2 through the hinges 9a, 9b. The hinges 9a, 9b are wire members folded back multiple times in the X-direction. These hinges function as a type of spring member so that stiffness of the filter support portion 60 can be enhanced. Particularly, in the wavelength selection filter apparatus 10, the filter 100 is attached, and therefore, the centers of gravity of the filter 100 and the filter support portion 60 upon tilting are shifted upward in the Z-direction with respect to an upper surface of a substrate 200. For example, in the configuration illustrated in FIG. 12, when an acceleration in the X-direction is provided to the filter 100, there is a probability that the filter 100 and the filter support portion 60 rotate about an axis extending in a Y-axis direction. On the other hand, according to the present variation, the filter support portion 60 are supported at two points by the hinges 9a, 9b. Thus, rotation moment about other axes than the tilting axis T can be reduced, and the filter 100 can be tilted in a desired direction.

<<Third Variation>>

FIG. 16 illustrates a plan view of the wavelength selection filter apparatus according to the present variation from below. Note that a configuration illustrated in FIG. 16 and the configuration illustrated in FIGS. 14 and 15 are only different from each other in a back surface configuration. The same reference numerals are used to represent elements similar to those of the second variation, and detailed description thereof will be omitted.

As illustrated in FIG. 16, second portions 60a are each provided at four corner portions of the filter support portion 60. Moreover, stoppers 53f are each provided at the second and third portions 53d, 53e of the coupling portion 53. At each of the second and third portions 53d, 53e, the stopper 53f is provided on the opposite side of the filter support portion 60, i.e., on a side closer to the third base member 23. Moreover, the length of the stopper 53f in the Y-direction is substantially the same as the lengths of the second and third portions 53d, 53e in the Y-direction. Further, as described in the first to third embodiments, an oxide layer 220 and a second silicon layer 230 of the substrate 200 are removed from the actuator 3, the diverting beam 4, the first beam 51, the second beam 52, the coupling portion 53, the mirror 6, and the filter support portion 60 as movable members of the displacement enlarging mechanism, and these movable members include the first silicon layer 210 as a device layer. On the other hand, each of the second portion 60a and the stopper 53f is configured such that the first silicon layer 210, the oxide layer 220, and the second silicon layer 230 are stacked on each other. That is, each of the second portion 60a and the stopper 53f has the same multilayer structure as that of the fixing portion 2. Note that each of the second portion 60a and the stopper 53f is obtained in such a manner that at the step of etching back layers of a mirror apparatus 1 illustrated in FIG. 5, the oxide layer 220 and the second silicon layer 230 of portions corresponding to the second portions 60a and the stoppers 53f are left using a not-shown mask.

According to the displacement enlarging mechanism according to the present variation, the second portions 60a are each first provided at four corner portions of the filter support portion 60, and therefore, impact provided to the filter support portion 60 upon attachment of the filter 100 can be reduced. As described above, the thickness of the first silicon layer 210, i.e., the thickness of other portions (the first portion) than the opening of the filter support portion 60 and the second portions 60a, is about 30 µm. On the other hand, the filter 100 is a rectangular parallelepiped body or a cubical body having a length of equal to less than 1 mm on one side. Typically, when the filter 100 is attached to the filter support portion 60, the substrate 200 provided with the displacement enlarging mechanism is mounted on a base (not shown), and the filter 100 is attached to the upper surface of the filter support portion 60 with, e.g., an adhesive. In this case, there is, between the filter support portion 60 and the base, the total thickness of the second silicon layer 230 and the oxide layer 220, i.e., a clearance of about 250 µm. Thus, there is a probability that the filter support portion 60 warps due to the impact upon attachment, the position of the filter 100 becomes unstable, and the filter 100 is attached with the filter 100 being shifted from a predetermined position. Moreover, there is a probability that depending on the magnitude of the impact upon attachment, the filter support portion 60 and the coupling portion 53 and the hinges 9a, 9b coupled to the filter support portion 60 are damaged.

On the other hand, according to the present variation, the second portions 60a are provided on the back side of the filter support portion 60, and therefore, the filter support portion 60 is stably held on the base through the second portions 60a. With this configuration, warpage of the filter support portion 60 and instability of the filter 100 upon attachment of the filter 100 can be reduced, and the filter 100 can be stably attached to the filter support portion 60. Moreover, the mass of the second portion 60a is about several % of the filter 100. However, the second portions 60a are provided on the back side of the filter support portion 60, and therefore, the center of gravity of the wavelength selection filter apparatus 10 in the Z-direction can be positioned closer to the tilting axis T. Thus, tilting of the filter 100 and the filter support portion 60 about other axes than the tilting axis T in response to force in the X-direction or the Y-direction can be reduced. Note that the second portions 60a are provided at the filter support portion 60, and therefore, the mass of the filter support portion 60 itself increases. When the filter support portion 60 becomes too heavy, there is a probability that the displacement amount of the filter support portion 60 in the Z-direction and therefore the displacement amount of the filter 100 in the Z-direction become smaller than a predetermined amount. In this case, the area of the second portion 60a may be decreased as viewed in plane. In FIG. 16, the second portions 60a may be simply narrowed, but may be formed in other shapes such as a ladder shape as viewed in plane.

Moreover, according to the present variation, the stoppers 53f are provided on the back side of the second and third portions 53d, 53e of the coupling portion 53, and therefore, more tilting of the filter 100 and the filter support portion 60 than a predetermined amount can be reduced. Further, tilting in other directions than a predetermined direction can be reduced. In the wavelength selection filter apparatus 10, when, e.g., the drive amount of the actuator 3 becomes equal to or greater than a predetermined amount due to a great mass of the filter 100, even in a case where the filter 100 tilts about the tilting axis T, there is a probability that the tilting amount of the filter 100 increases and a rotation moment of equal to or greater than an acceptable range acts on the filter 100 to damage the filter support portion 60, the coupling portion 53, or the hinges 9a, 9b. In a case where an acceleration in the X-direction or the Y-direction is provided to the filter 100, the filter 100 tilts about other axes than the tilting axis T, and similarly, there is a probability that the filter support portion 60, the coupling portion 53, or the hinges 9a, 9b are damaged.

On the other hand, according to the present variation, when the filter 100 and the filter support portion 60 tilt about the tilting axis T by equal to or greater than the predetermined amount, any of end portions of the stoppers 53f in the Y-direction comes into contact with the opposing third base member 23, and stops further tilting of the filter 100 and the filter support portion 60. The same applies to a case where an acceleration of equal to or greater than a predetermined amount in the Y-direction is provided to the filter 100. In a case where an acceleration of equal to or greater than a predetermined amount in the X-direction is provided to the filter 100, any of the stopper 53f on the back side of the second portion 53d and the stopper 53f on the back side of the third portion 53e comes into contact with the opposing third base member 23 in the X-direction, and therefore, can stop tilting of the filter 100 about other axes than the tilting axis T. With these configurations, unexpected damage of the filter support portion 60, the coupling portion 53, etc. can be prevented, and the filter 100 and the filter support portion 60 can be tilted in a predetermined direction within a predetermined area. Note that the stoppers 53f and the opposing third base member 23 are provided with such a predetermined spacing that a predetermined amount of tilting of the filter 100 and the filter support portion 60 is not interfered.

<<Fourth Variation>>

Figure 17A:
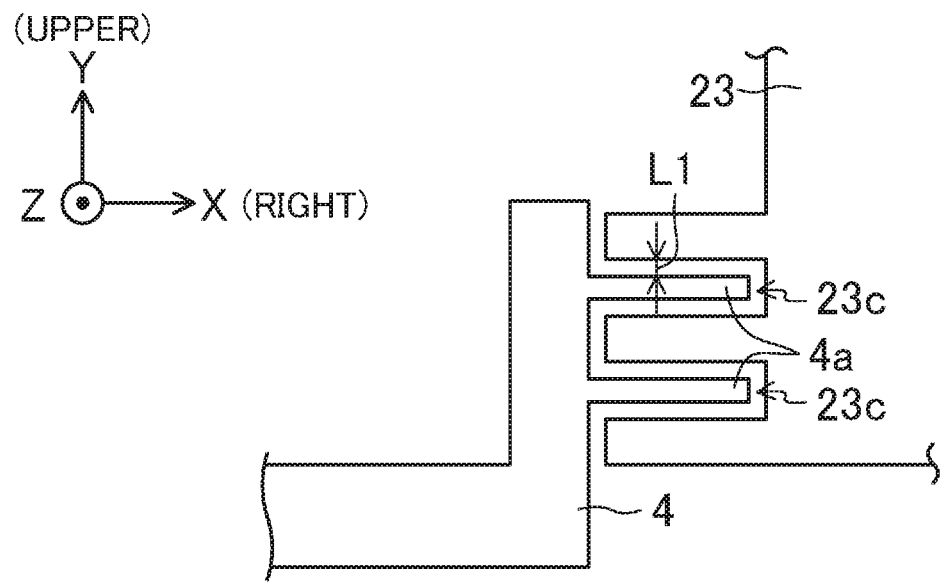
FIG. 17A is a partially-enlarged view of a wavelength selection filter apparatus according to a fourth variation, the partially-enlarged view corresponding to a region A illustrated in FIG. 14.
Figure 17B:
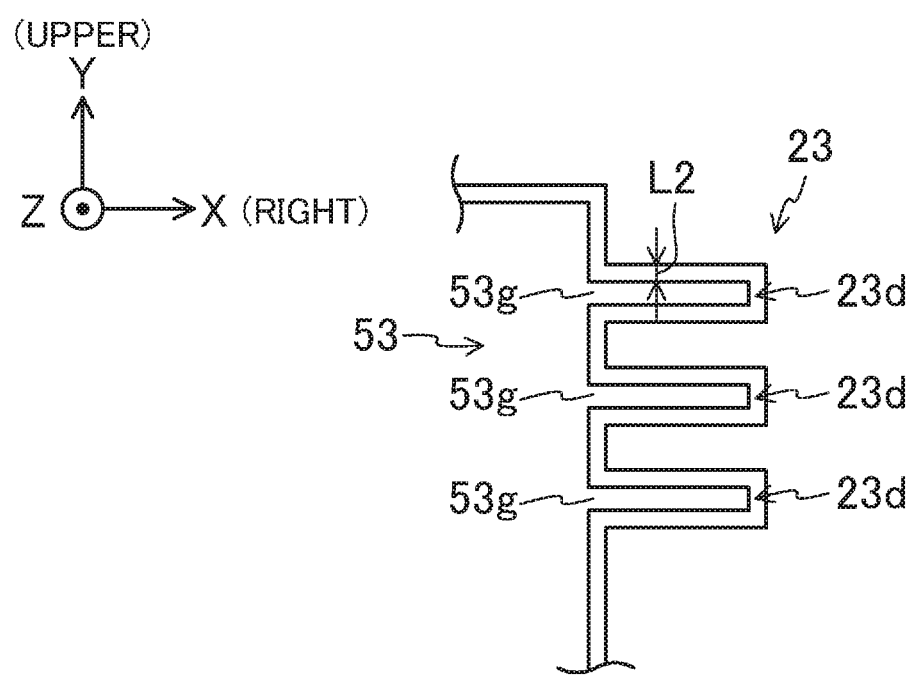
FIG. 17B is a partially-enlarged view of the wavelength selection filter apparatus according to the fourth variation, the partially-enlarged view corresponding to a region B illustrated in FIG. 14.

FIG. 17A illustrates a partially-enlarged view of the wavelength selection filter apparatus according to the present variation, and FIG. 17B illustrates a partially-enlarged view of another portion of the wavelength selection filter apparatus. Moreover, FIG. 17A is a partially-enlarged view corresponding to a region A illustrated in FIG. 14, and FIG. 17B is a partially-enlarged view corresponding to a region B illustrated in FIG. 14. Note that in the present variation, the same reference numerals are used to represent elements similar to those of the second and third variations, and detailed description thereof will be omitted.

A difference among a configuration described in the present variation and the configurations described in the second and third variations is that first protruding portions 4a or second protruding portions 53g are provided at at least any of the diverting beam 4 and the coupling portion 53. Each of the first protruding portion 4a and the second protruding portion 53g includes the first silicon layer 210, and is provided to extend in a direction parallel to the upper surface of the substrate 200, i.e., the X-direction in the present variation. Moreover, recessed portions 23c and/or recessed portions 23d configured to house the first protruding portions 4a or the second protruding portions 53g are formed at the third base member 23. As illustrated in each of FIGS. 17A and 17B, the recessed portion 23c and the first protruding portion 4a are arranged with a predetermined spacing L1, and the recessed portion 23d and the second protruding portion 53g are arranged with a predetermined spacing L2.

According to the present variation, the surface area of the diverting beam 4 or the coupling portion 53 can be increased. Generally, a heat dissipation time constant upon heat dissipation from an object is represented by Expression (1) below:

$$\tau c = mc/hA \quad (1)$$

where $\tau c$: the heat dissipation time constant;
m: the mass of the object;
c: the specific heat of the object;
h: the heat transfer coefficient of the object; and
A: the surface area of the object.

As clearly seen from Expression (1), the surface area A of the object is increased, and in this manner, the heat dissipation time constant $\tau c$ decreases. That is, heat is dissipated from the object within a shorter period of time. Thus, the first protruding portions 4a and/or the second protruding portions 53g are provided so that the heat dissipation time constant $\tau c$ of the diverting beam 4 and/or the coupling portion 53 can be decreased as described in Expression (1), and therefore, the response speed of the coupling portion 53 or the filter support portion 60 as the movement portion can be shortened. The response speed of the movement portion corresponds to time until the movement portion moves to a predetermined position after voltage has been applied to the actuator 3. In addition, heat transmitted from the actuator 3 to the diverting beam 4 or the coupling portion 53 can be promptly dissipated. Consequently, an increase in the temperature of the filter 100 can be suppressed, and a change in optical characteristics of the filter 100 due to a temperature change can be prevented. Moreover, thermal damage on the filter 100 can be reduced.

Moreover, in the present variation, the above-described intervals L1, L2 are set to equal to or less than several μm, and therefore, heat dissipation from the diverting beam 4 and/or the coupling portion 53 can be further accelerated. Generally, in a case where there is a temperature difference between two objects arranged in atmosphere and facing each other with a spacing, heat is exchanged between both objects through air. However, in the present embodiment, the interval between the diverting beam 4 and/or the coupling portion 53 and the third base member 23 is a small value of equal to or less than several μm. With this order of the interval, thermal resistance is small, and therefore, heat is promptly dissipated from the first protruding portions 4a and/or the second protruding portions 53g to the third base member 23.

Moreover, according to the present variation, in a case where the filter 100 and the filter support portion 60 tilt by equal to or greater than a predetermined amount, the first protruding portions 4a and/or the second protruding portions 53g can contact the third base member 23 to prevent a predetermined amount of tilting of the filter 100 and the filter support portion 60 or more. Further, even in a case where the filter support portion 60 tilts about other axes than the tilting axis, such tilting can be reduced. With these configurations, unexpected damage of the filter support portion 60, the coupling portion 53, etc. can be prevented, and the filter 100 and the filter support portion 60 can be tilted in the predetermined direction within the predetermined area. Note that the first protruding portions 4a and the second protruding portions 53g include the first silicon layer 210, and therefore, when these members collide with the third base member 23 at a certain speed or higher, these members 4a, 53g might be damaged in some cases. Thus, in a case where the first protruding portions 4a and/or the second protruding portions 53g are used as the stoppers as described above, the strength thereof, specifically the lengths of the first protruding portion 4a and/or the second protruding portion 53g in the X-direction and the Y-direction and the number of each member, needs to be properly set. Note that according to, e.g., required heat dissipation specifications, only the first protruding portions 4a and the recessed portions 23c may be provided, or only the second protruding portions 53g and the recessed portions 23d may be provided. All of the first and second protruding portions 4a, 53g and the recessed portions 23c, 23d may be provided.

<<Fifth Variation>>

Figure 18:
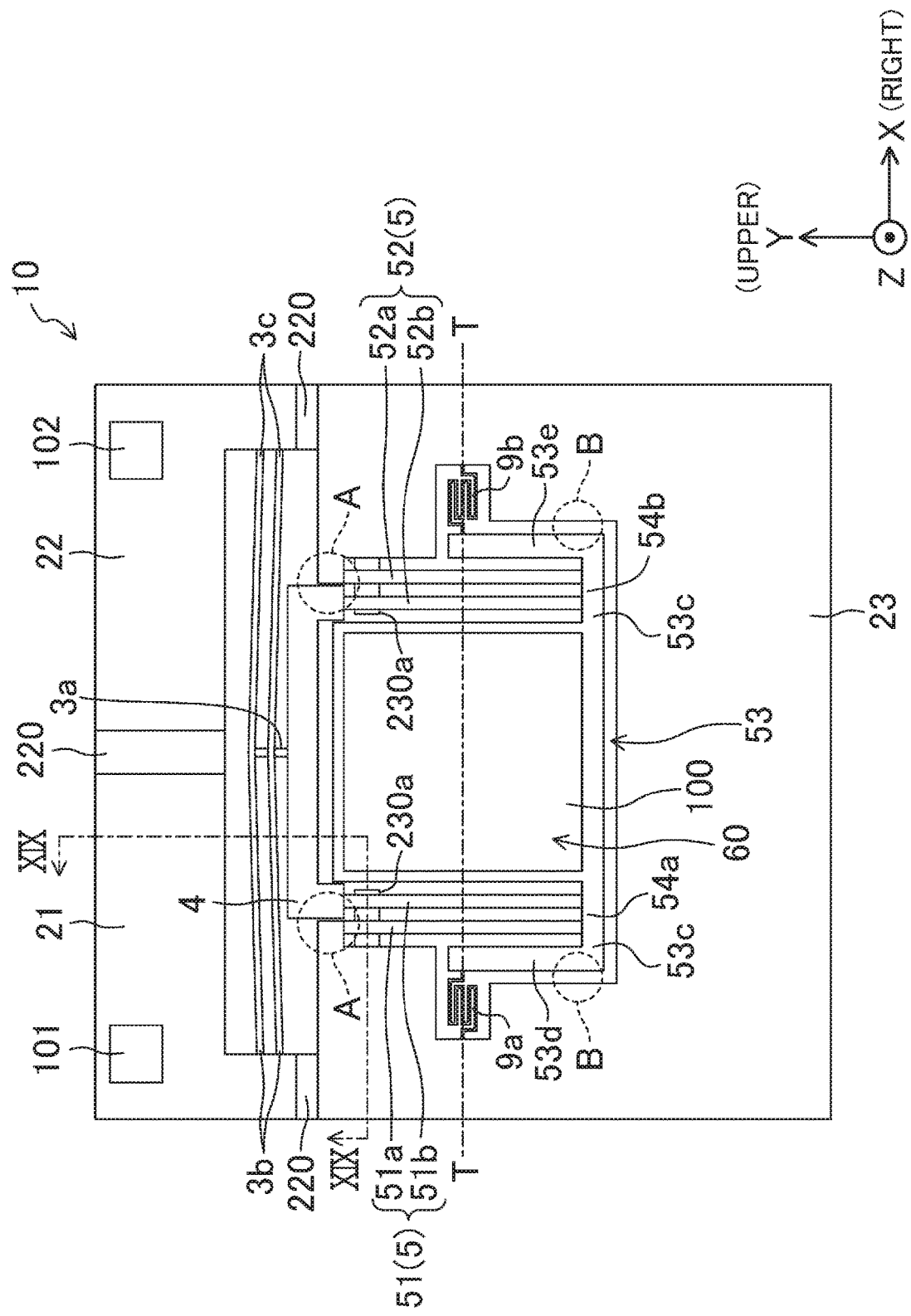
FIG. 18 is a plan view of a wavelength selection filter apparatus according to a fifth variation.
Figure 19:
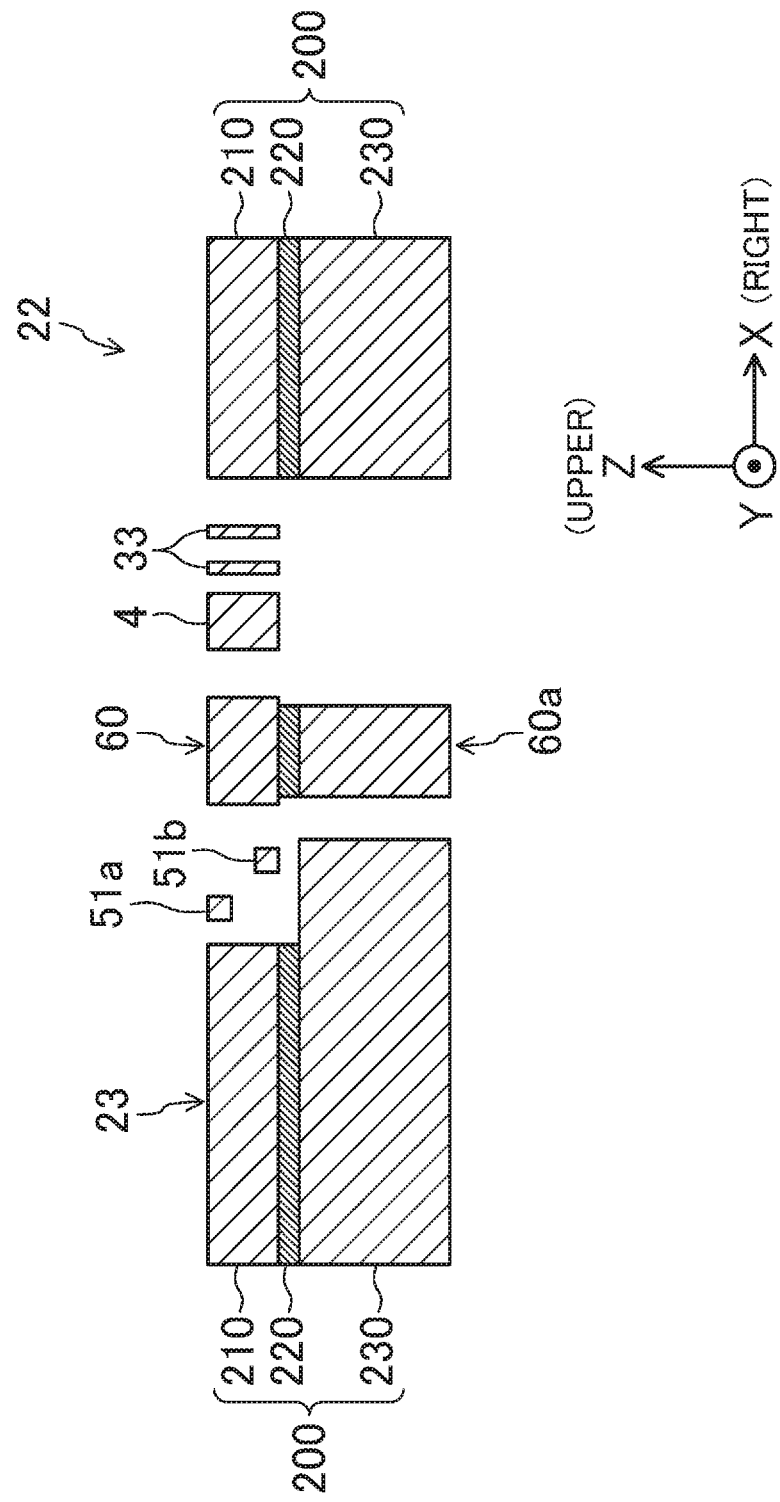
FIG. 19 is a sectional view along an XIX-XIX line of FIG. 18.

FIG. 18 illustrates a plan view of the wavelength selection filter apparatus according to the present variation, and FIG. 19 illustrates a sectional view along an XIX-XIX line of FIG. 18. Moreover, FIG. 20 illustrates a plan view of a heat dissipation block according to the present variation from below. Note that in the present variation, the same reference numerals are used to represent elements similar to those of the second and third variations, and detailed description thereof will be omitted. Moreover, the displacement enlarging mechanism illustrated in FIGS. 18 and 19 is the same as the configuration illustrated in FIG. 16, except for the heat dissipation block 230a.

A difference among a configuration described in the present variation and the configurations described in the first to third embodiments and the second to fourth variations is that the heat dissipation block 230a is provided with a predetermined spacing from the beams 51, 52 on the lower side of the first beam 51 and the second beam 52 in the Z-direction. As illustrated in FIGS. 18 and 19, the heat dissipation block 230a includes the second silicon layer 230 as a handle layer, and one end of the heat dissipation block 230a in the X-direction is coupled to the second silicon layer 230 of the third base member 23. Moreover, the Box layer 220 is interposed between the heat dissipation block 230a and a first electrode 101 and between the heat dissipation block 230a and a second electrode 102, and therefore, the heat dissipation block 230a is electrically insulated from the first and second base members 21, 22. Further, as illustrated in FIG. 19, an interval between each of the first beam 51 and the second beam 52 and the heat dissipation block 230a corresponds to the thickness (1 μm) of the Box layer 220.

According to the present embodiment, heat transmitted from the actuator 3 to the first and second beams 51, 52 can be promptly dissipated through the heat dissipation block 230a. As described in the fourth variation, when the interval between two objects reaches equal to or less than several μm, even if air is interposed, heat is promptly dissipated from the first beam 51 and the second beam 52 to the heat dissipation block 230a. The heat dissipated to the heat dissipation block 230a is directly dissipated from the heat dissipation block 230a to the atmosphere, or dissipated from the heat dissipation block 230a through the second silicon layer 230 of the first and second base members 21, 22. Thus, an increase in the temperature of the filter 100 can be suppressed, and a change in the optical characteristics of the filter 100 due to a temperature change can be prevented. Moreover, the thermal damage on the filter 100 can be reduced. Further, no oxide layer 220 as the Box layer is provided between each of the first and second beams 51, 52 and the heat dissipation block 230a, and therefore, the first and second beams 51, 52 are displaceable in the Z-direction. Note that arrangement and detailed portions of the heat dissipation block 230a need to be properly set such that these beams 51, 52 do not contact the heat dissipation block 230a due to downward displacement in the Z-direction.

The heat dissipation block 230a is formed in such a manner that at the step of etching the back layers of the mirror apparatus 1 illustrated in FIG. 5, the second silicon layer 230 is etched using a not-shown mask such that the heat dissipation block 230a remains and the oxide layer 220 is subsequently removed by, e.g., etching using a hydrofluoric acid-based chemical, for example. However, a portion where the first and second beams 51, 52 and the heat dissipation block 230a overlap with each other as viewed in plane is about several hundreds of μm to several mm in the X-direction. Thus, depending on the width of the overlapping portion in the Y-direction, there is a probability that the amount of etching of the Box layer 220 increases, the oxide layer 220 of the first and second base members 21, 22 are etched from the side, and therefore, the first and second base members 21, 22 are deformed upon drive and displacement of the actuator 3. Moreover, there is a probability that in wet etching using a chemical, fixation due to member surface tension or electrostatic attractive force is caused.

For these reasons, as illustrated in FIG. 20, multiple lightening portions (holes) 231 are provided at the heat dissipation block 230a so that the above-described problems can be avoided. At the step of forming the heat dissipation block 230a, when the oxide layer 220 is removed, the chemical enters through the lightening portions 231, and therefore, the time of removing a portion of the oxide layer 220 contacting the heat dissipation block 230a is shortened. Moreover, the lightening portions 231 are provided so that a facing area between each of the first and second beams 51, 52 and the heat dissipation block 230a can be decreased. Thus, fixation due to the surface tension or the electrostatic attractive force at the first and second beams 51, 52 and the heat dissipation block 230a can be reduced. With the above-described configuration, the surface tension or the electrostatic attractive force between each of the first beam 51 and the second beam 52 and the heat dissipation block 230a can be weakened to prevent fixation of these components or damage of the first beam 51 and the second beam 52. Moreover, the lightening portions 231 are provided so that the surface area of the heat dissipation block 230a can be increased and heat can be promptly dissipated from the heat dissipation block 230a. Note that in FIG. 20, the heat dissipation block 230a is arranged on a side closer to the diverting beam 4, but the present technique is not specifically limited to above. For example, in FIG. 20, the heat dissipation block 230a may be arranged below a center portion of the first beam 51 or a center portion of the second beam 52. In this case, the position of the heat dissipation block 230a needs to be properly set such that the filter support portion 60 and the heat dissipation block 230a do not contact each other. Moreover, as viewed in plane, the heat dissipation block 230a may be arranged to partially or entirely overlap with the diverting beam 4. In this case, both end portions of the heat dissipation block 230a in the X-direction may be coupled to the third base member 23, and such coupling portions may face each other in the X-direction.

Other Embodiments

Note that each of the first actuator 7 and the second actuator 8 may include a single actuator. Moreover, the sizes and structures of the first actuator 7 and the second actuator 8 are not necessarily the same as each other, and may be different from each other. The number of actuators may be different between the first actuator 7 and the second actuator 8. For example, the first actuator 7 may include a single actuator, and the second actuator 8 may include two actuators. Moreover, the length of the member forming the first actuator 7 and the length of the member forming the second actuator 8 may be different from each other. Further, a material having a different thermal expansion coefficient from that of silicon as the material of the upper first beam 51a and the lower first beam 51b may be provided on upper surfaces of these beams 51a, 51b to form a bimetal structure.

Heat generated at the actuator 3 to the first and second actuators 7, 8 and propagating to the beam 5 can be utilized for, e.g., tilting of the mirror 6. A similar configuration can be also employed for the upper second beam 52*a* and the lower second beam 52*b*.

Moreover, at the folded-back portions 54 in the first embodiment or the first and second folded-back portions 54*a*, 54*b* in the second embodiment, the second end portions 5*b* and the third end portions 5*c* may be coupled to the folded-back portions 54 or the first and second folded-back portions 54*a*, 54*b* at the substantially same position. Specifically, for the first beam 51, arrangement may be employed such that any of the second end portion 5*b* and the third end portion 5*c* is positioned on the upper side of the folded-back portion 54 and the second end portion 5*b* and the third end portion 5*c* are directly coupled to each other. In this case, press force and pull force can be applied to the folded-back portions 54 by drive of the actuator 3. In some cases, heat generated at the actuator 3 and the first and second actuators 7, 8 propagates to the mirror 6, silicon in the first silicon layer 210 forming the mirror 6 is diffused into the metal film 61, and light reflection characteristics etc. are changed. For preventing such silicon diffusion, a silicon diffusion prevention film may be provided on the metal film 61. For example, the metal film 61 may be an Au/Pt/Ti film. In all of the above-described embodiments including the variations, the above-described configurations can be applied to the corresponding members, as necessary.

Note that in the third embodiment and the second to fifth variations, the wavelength selection filter apparatus 10 configured such that the filter 100 is mounted on the upper surface (the upper surface in the Z-direction) of the filter support portion 60 has been described, but as illustrated in FIG. 21, the filter 100 may be mounted on a back surface (a lower surface in the Z-direction) of the filter support portion 60. Note that the displacement enlarging mechanism illustrated in FIG. 21 is the same as the displacement enlarging mechanism illustrated in FIG. 14, and the section illustrated in FIG. 21 corresponds to an XZ plane passing through the tilting axis T illustrated in FIG. 14. The filter 100 is arranged as described above so that the filter 100 can be attached to the filter support portion 60 with the upper surface of the substrate 200, i.e., an upper surface of the first silicon layer 210, contacting the base. With this configuration, there is no clearance between the filter support portion 60 and the base, and the filter 100 can be stably attached to the filter support portion 60. Moreover, as clearly seen from FIG. 21, the height of the wavelength selection filter apparatus 10 in the Z-direction can be decreased. In the configurations illustrated in FIGS. 12 and 14, the height of the wavelength selection filter apparatus 10 in the Z-direction corresponds to the sum of the thickness of the substrate 200 and the height of the filter 100 in the Z-direction. On the other hand, in the configuration illustrated in FIG. 21, the height of the wavelength selection filter apparatus 10 in the Z-direction corresponds to the sum of the thickness of the first silicon layer 210 and the height of the filter 100 in the Z-direction. That is, the height of the wavelength selection filter apparatus 10 in the Z-direction can be decreased by the sum (about 250 µm) of the thicknesses of the oxide layer 220 and the second silicon layer 230. Thus, the size of the wavelength selection filter apparatus 10 can be reduced.

The present technique is not limited to above, and the components described in each of the above-described embodiments and variations may be combined to form a new embodiment. For example, the displacement enlarging mechanism illustrated in FIGS. 14 and 15 may be applied to the configuration illustrated in FIG. 1. Moreover, the second portions 60*a* of the filter support portion 60 illustrated in FIG. 16 may be provided in the configurations illustrated in FIGS. 12 and 13. Further, the heat dissipation block 230*a* illustrated in FIGS. 18 to 20 may be applied to the configurations illustrated in FIGS. 1, 6, and 9. Note that in the case of driving the actuator 3 or the actuators 7, 8, the position of the heat dissipation block 230*a* needs to be properly set such that the heat dissipation block 230*a* does not contact the first and second beams 51, 52 and the filter support portion 60.

Moreover, the displacement enlarging mechanism disclosed herein may be applied to an infrared sensor. In this case, an infrared absorber may be provided at the mirror 6 illustrated in FIGS. 1, 6, and 9, for example.

INDUSTRIAL APPLICABILITY

The technique disclosed herein can tilt the movement portion such as the mirror in the direction crossing the surface of the movement portion and can increase the tilting amount, and therefore, is useful in application to an optical apparatus.

DESCRIPTION OF REFERENCE CHARACTERS

1 Mirror Apparatus
2 Fixing Portion
3 Actuator
4 Diverting Beam
4*a* First Protruding Portion
23*c*, 23*d* Recessed Portion
51 First Beam (Beam)
52 Second Beam (Beam)
53 Coupling Portion (Movement Portion)
53*a* First Coupling Portion (Movement Portion)
53*b* Second Coupling Portion (Movement Portion)
54 Folded-Back Portion
54*a* First Folded-Back Portion
54*b* Second Folded-Back Portion
60 Filter Support Portion
100 Filter
230*a* Heat Dissipation Block

The invention claimed is:

1. A displacement enlarging mechanism comprising:
   a substrate;
   a fixing portion provided at the substrate;
   an actuator coupled to the fixing portion;
   a beam extending in a direction substantially parallel to an upper surface of the substrate and having a base end side coupled to the actuator, extending toward the base end side and having folded back in a direction crossing the upper surface at a folded-back portion of an intermediate portion, and coupled to the fixing portion on a tip end side; and
   a movement portion coupled to the folded-back portion of the beam,
   wherein the actuator drives the beam to push or pull the beam from the base end side in a folded-back portion direction.

2. The displacement enlarging mechanism according to claim 1, wherein
   the beam includes a first beam and a second beam, and the movement portion is provided between the first beam and the second beam.

3. The displacement enlarging mechanism according to claim 2, wherein the folded-back portion includes a first folded-back portion and a second folded-back portion formed by folding back of the first beam and the second beam, and the movement portion is coupled to the first folded-back portion and the second folded-back portion.

4. The displacement enlarging mechanism according to claim 2, wherein the actuator includes a first actuator and a second actuator, and the first beam is coupled to the first actuator, and the second beam is coupled to the second actuator.

5. The displacement enlarging mechanism according to claim 1, wherein the movement portion is coupled to the folded-back portion of the beam through a hinge.

6. The displacement enlarging mechanism according to claim 1, wherein the movement portion is coupled to the folded-back portion of the beam and the fixing portion through hinges.

7. The displacement enlarging mechanism according to claim 1, wherein the base end side of the beam is folded back and is coupled to the actuator.

8. The displacement enlarging mechanism according to claim 1, wherein the actuator is coupled to the fixing portion in a curved or bent state, and is a thermal actuator to be driven by heating.

9. The displacement enlarging mechanism according to claim 1, wherein the beam has a first protruding portion extending in the direction parallel to the upper surface of the substrate.

10. The displacement enlarging mechanism according to claim 1, wherein the movement portion has a second protruding portion extending in the direction parallel to the upper surface of the substrate.

11. The displacement enlarging mechanism according to claim 9, wherein the fixing portion has a recessed portion configured to house the first protruding portion, and a side surface of the recessed portion and a side surface of the first protruding portion are provided with a predetermined spacing.

12. The displacement enlarging mechanism according to claim 1, wherein a heat dissipation block is provided with a predetermined spacing from the beam on a lower side of the beam.

13. The displacement enlarging mechanism according to claim 12, wherein the substrate is configured such that a device layer, an oxide layer, and a handle layer are stacked on each other in this order, and the beam includes the device layer, and the heat dissipation block includes the handle layer and is coupled to the fixing portion.

14. The displacement enlarging mechanism according to claim 1, wherein the substrate is configured such that the device layer, the oxide layer, and the handle layer are stacked on each other in this order, and the actuator and the beam include the device layer, and the movement portion includes a first portion having the device layer and a second portion having the device layer, the oxide layer, and the handle layer.

15. An optical apparatus comprising:

the displacement enlarging mechanism according to claim 1;

a first electrode arranged on the fixing portion of the displacement enlarging mechanism and electrically connected to one end of the actuator; and a second electrode arranged on the fixing portion of the displacement enlarging mechanism and electrically connected to the other end of the actuator, wherein the movement portion reflects light entering the displacement enlarging mechanism, allows the light to penetrate the movement portion, or absorbs the light.

16. The displacement enlarging mechanism according to claim 3, wherein the actuator includes a first actuator and a second actuator, and the first beam is coupled to the first actuator, and the second beam is coupled to the second actuator.

17. The displacement enlarging mechanism according to claim 10, wherein the fixing portion has a recessed portion configured to house the second protruding portion, and a side surface of the recessed portion and a side surface of the second protruding portion are provided with a predetermined spacing.

* * * * *